US010005277B2

(12) United States Patent
Takagi

(10) Patent No.: US 10,005,277 B2
(45) Date of Patent: *Jun. 26, 2018

(54) LIQUID DISCHARGING APPARATUS, HEAD UNIT, INTEGRATED CIRCUIT DEVICE FOR CAPACITIVE LOAD DRIVING, CAPACITIVE LOAD DRIVING CIRCUIT, AND CONTROL METHOD OF LIQUID DISCHARGING APPARATUS

(71) Applicant: Seiko Epson Corporation, Tokyo (JP)

(72) Inventor: Tetsuo Takagi, Okaya (JP)

(73) Assignee: Seiko Epson Corporation (JP)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/336,162

(22) Filed: Oct. 27, 2016

(65) Prior Publication Data

US 2017/0043576 A1 Feb. 16, 2017

Related U.S. Application Data

(63) Continuation of application No. 14/938,187, filed on Nov. 11, 2015, now Pat. No. 9,505,212.

(30) Foreign Application Priority Data

Dec. 12, 2014 (JP) ................................. 2014-251763

(51) Int. Cl.
*B41J 2/045* (2006.01)
*H02M 3/07* (2006.01)
*H03K 17/687* (2006.01)

(52) U.S. Cl.
CPC ....... *B41J 2/04541* (2013.01); *B41J 2/04551* (2013.01); *B41J 2/04581* (2013.01); *B41J 2/04588* (2013.01); *B41J 2/04593* (2013.01); *B41J 2/04596* (2013.01); *H02M 3/07* (2013.01); *H03K 17/687* (2013.01)

(58) Field of Classification Search
CPC .......................... B41J 2/04541; B41J 2/04581; B41J 2/04588; B41J 2/04593; B41J 2/04596; B41J 2/04501; B41J 2/04551
USPC .......................................... 347/9, 10, 14, 68
See application file for complete search history.

(56) References Cited

U.S. PATENT DOCUMENTS 9,505,212 B2 * 11/2016 Takagi ................. B41J 2/04551
2001/0009435 A1 7/2001 Nagumo
2008/0198191 A1 8/2008 Oshima et al.
(Continued)

FOREIGN PATENT DOCUMENTS

JP 2013-146968 A 8/2013

*Primary Examiner* — Jannelle M Lebron
(74) *Attorney, Agent, or Firm* — Harness, Dickey & Pierce, P.L.C.

(57) ABSTRACT

There is provided a driving circuit for driving a capacitive load including: a modulation portion which generates a modulation signal pulse-modulated from a source signal; a gate driver which generates an amplification control signal based on the modulation signal; a transistor which generates an amplification modulation signal amplified from the modulation signal based on the amplification control signal; a low pass filter which demodulates the amplification modulation signal and generates a driving signal; a feedback circuit which sends back the driving signal to the modulation portion; a boosting circuit which supplies a voltage which has been boosted.

7 Claims, 11 Drawing Sheets

(56) References Cited

U.S. PATENT DOCUMENTS

| | | | |
|---|---|---|---|
| 2012/0291550 A1* | 11/2012 | Kato | G01C 19/5776 73/504.12 |
| 2013/0187967 A1 | 7/2013 | Abe | |
| 2015/0246531 A1 | 9/2015 | Abe et al. | |

* cited by examiner

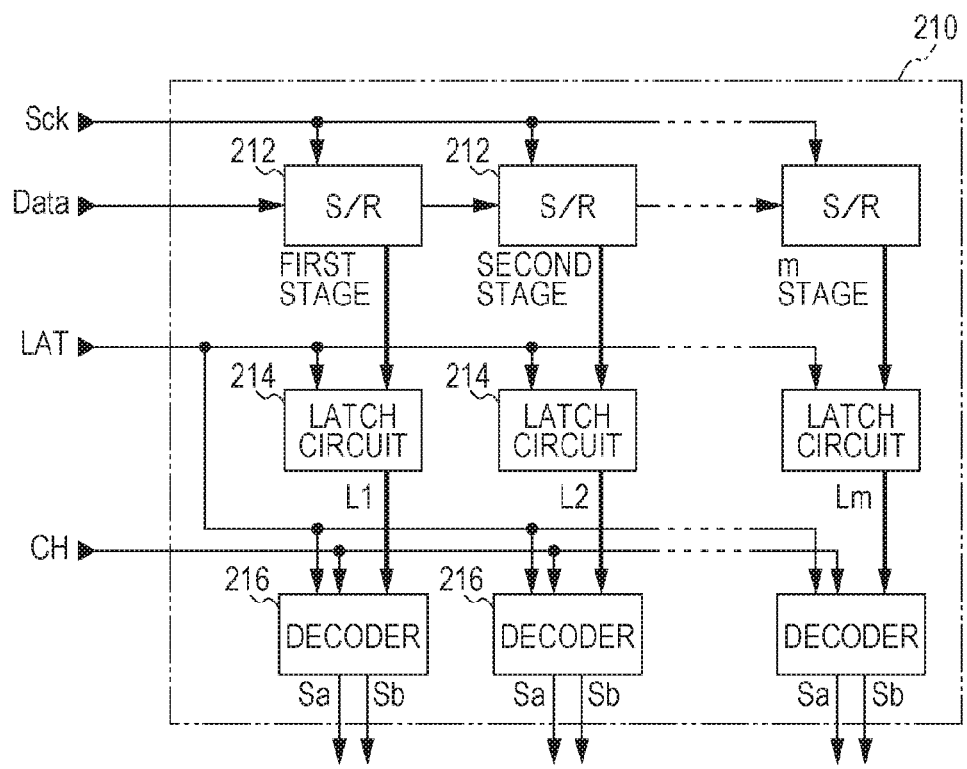

| ST1 | ST2 | OPERATION MODE | BOOSTING CIRCUIT | Ldr | Hdr |
|---|---|---|---|---|---|
| 0 | 0 | RESET | OFF | LOW | LOW |
| 0 | 1 | SLEEP 1 | OFF | LOW | LOW |
| 1 | 0 | SLEEP 2 | ON | HIGH | LOW |
| 1 | 1 | NORMAL OPERATION | ON | HIGH/LOW | LOW/HIGH |

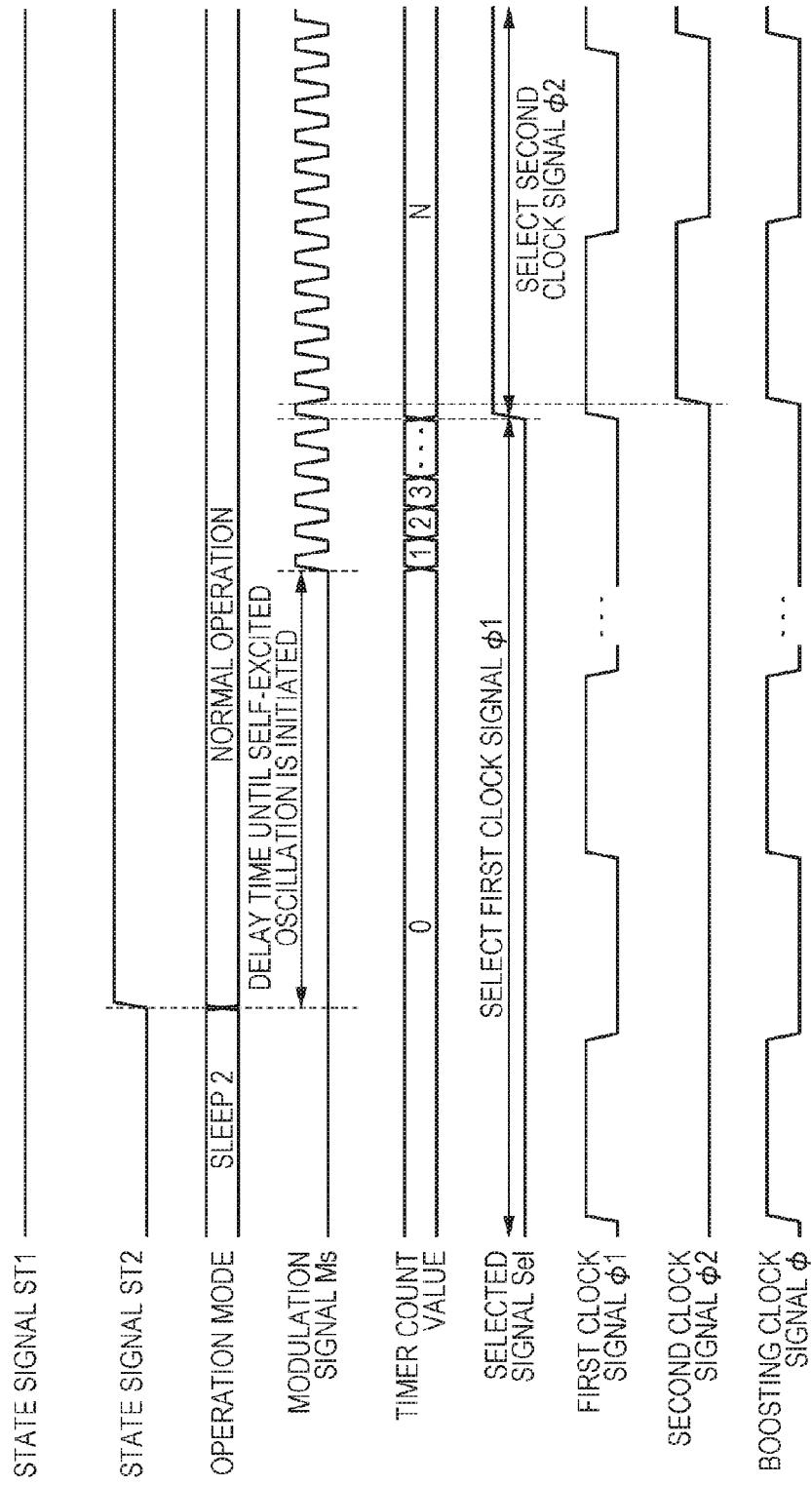

LIQUID DISCHARGING APPARATUS, HEAD UNIT, INTEGRATED CIRCUIT DEVICE FOR CAPACITIVE LOAD DRIVING, CAPACITIVE LOAD DRIVING CIRCUIT, AND CONTROL METHOD OF LIQUID DISCHARGING APPARATUS

CROSS-REFERENCE TO RELATED APPLICATIONS

This application is a continuation of U.S. patent application Ser. No. 14/938,187, filed Nov. 11, 2015, which claims priority to Japanese Patent Application No. 2014-251763, filed Dec. 12, 2014, the disclosures of both applications are expressly incorporated by reference herein in their entireties.

BACKGROUND

1. Technical Field

The present invention relates to a liquid discharging apparatus, a head unit, an integrated circuit device for capacitive load driving, a capacitive load driving circuit, and a control method of a liquid discharging apparatus.

2. Related Art

In a liquid discharging apparatus, such as an ink jet printer, which discharges ink and prints an image or a document, an apparatus which uses a piezoelectric element (for example, a piezo element) has been known. The piezoelectric elements are provided corresponding to each of a plurality of nozzles in a head unit, and each of the piezoelectric elements is driven in accordance with driving signals. Accordingly, a predetermined amount of ink (liquid) is discharged from the nozzle at a predetermined timing, and a dot is formed. Since the piezoelectric element is a capacitive load, such as a capacitor, in terms of electricity, it is necessary to supply a sufficient amount of current in order to operate the piezoelectric elements of each nozzle.

For this reason, in the above-described liquid discharging apparatus, the piezoelectric elements are driven as a driving signal which is amplified by an amplifying circuit is supplied to a head unit (ink jet head). An example of the amplifying circuit includes a type which performs current amplification with respect to a source signal before the amplification by using a class-AB amplifier, but since energy efficiency is not excellent, in recent years, a type in which a class-D amplifier is used has been suggested (refer to JP-A-2013-146968).

The liquid discharging apparatus suggested in JP-A-2013-146968, the class-D amplifier for the ink jet head is driven based on a signal which is pulse-modulated in a self-excited oscillation type modulation method. In order to obtain (attain high accuracy of an output waveform) the discharge accuracy by the class-D amplifier for the ink jet head, high oscillation frequency (1 MHz to 8 MHz) which is 20 or more times higher than that of an audio class-D amplifier is necessary. However, due to the high oscillation frequency, the influence of various types of noise is likely to occur. For example, there is a possibility that malfunction of the class-D amplifier is generated due to the noise generated in a boosting circuit for the class-D amplifier, and thus, the discharge accuracy deteriorates. In order to prevent malfunction of the class-D amplifier due to noise, it is effective to synchronize a signal of a boosting clock of the boosting circuit with the modulation signal. However, the inventors have found that, in a case where the self-excited oscillation type class-D amplifier is used in reducing the size of the circuit scale for reducing the size of the liquid discharging apparatus, since the self-excited oscillation is not immediately started, there is a problem that boosting is stopped when performing of the synchronization is desired before the start of the self-excited oscillation. The driving voltage decreases due to the stop of the boosting, and the self-excited oscillation is stopped. Furthermore, the boosting of the boosting clock which is synchronized with the self-excited oscillation is not generated due to the stop of the self-excited oscillation, and it is not possible to avoid a dead lock state where both the boosting and the self-excited oscillation are not generated.

SUMMARY

An advantage of some aspects of the invention is to provide a liquid discharging apparatus, a head unit, an integrated circuit device for capacitive load driving, a capacitive load driving circuit, and a control method of a liquid discharging apparatus, in which it is possible to reduce the tendency of the discharging accuracy to deteriorate due to noise of a boosting circuit. In addition, the invention is to provide a liquid discharging apparatus, a head unit, an integrated circuit device for capacitive load driving, a capacitive load driving circuit, and a control method of a liquid discharging apparatus, in which it is possible to reduce the tendency of self-excited oscillation to be stopped.

The invention can be realized in the following aspects or application examples.

APPLICATION EXAMPLE 1

According to this application example, there is provided a liquid discharging apparatus including: a modulation portion which generates a modulation signal pulse-modulated from a source signal; a gate driver which generates an amplification control signal based on the modulation signal; a transistor which generates an amplification modulation signal amplified from the modulation signal based on the amplification control signal; a low pass filter which demodulates the amplification modulation signal and generates a driving signal; a feedback circuit which sends back the driving signal to the modulation portion; a boosting circuit which supplies a voltage which has been boosted based on any one of a first clock signal and a second clock signal to the gate driver; a boosting control portion which controls boosting in the boosting circuit; a piezoelectric element which is displaced as the driving signal is applied; a cavity in which the inside is filled with liquid and an internal volume changes due to the displacement of the piezoelectric element; and a nozzle which communicates with the cavity, and discharges the liquid inside the cavity as liquid droplets in accordance with the change in the internal volume of the cavity, in which the boosting control portion controls the boosting based on the second clock signal after controlling the boosting based on the first clock signal, and in which a switching point of rising or falling of the second clock signal is synchronized with the modulation signal.

In this case, since the switching point of the rising or falling of the second clock signal is synchronized with the modulation signal generated by self-excited oscillation, it is always possible to set a timing when noise is generated in the boosting circuit close to a desired timing (a timing when the influence of noise is unlikely to occur) in the self-excited oscillation as the boosting circuit performs the boosting based on the second clock signal. Therefore, it is possible to reduce the influence of noise of the boosting circuit on the driving signal, and to reduce the tendency of the discharge accuracy to deteriorate.

In this case, the boosting circuit can perform the boosting based on the first clock signal before the modulation signal is generated by the self-excited oscillation (before the second clock signal is generated). In addition, since the boosting circuit can perform the boosting based on the second clock signal after the second clock signal is generated, it is possible to reduce the tendency of the boosted voltage to decrease and the self-excited oscillation to be stopped.

APPLICATION EXAMPLE 2

In the liquid discharging apparatus according to the application example, the boosting control portion may generate the second clock signal based on the modulation signal and the first clock signal.

In this case, it is possible to synchronize the second clock signal with the modulation signal which is generated by self-excited oscillation.

APPLICATION EXAMPLE 3

In the liquid discharging apparatus according to the application example, the boosting control portion may control the boosting based on the first clock signal in a first mode, shift from the first mode to a second mode, control the boosting based on the first clock signal before a predetermined period elapses after shifting to the second mode in the second mode, and control the boosting based on the second clock signal after the predetermined period elapses.

In this case, the boosting circuit can continue to perform the boosting based on the first clock signal even after the shift to the second mode. In addition, when the predetermined period is set to be longer than a period which is required until the self-excited oscillation is initiated after the shift to the second mode, the boosting circuit can continue to perform the boosting based on the second clock signal after the predetermined period elapses. Therefore, it is possible to reduce the tendency of the boosted voltage to decrease and the self-excited oscillation to be stopped.

APPLICATION EXAMPLE 4

In the liquid discharging apparatus according to the application example, the boosting control portion may control the boosting based on the second clock signal when at least one pulse included in the modulation signal is input to the boosting control portion.

In this case, since the boosting circuit performs the boosting based on the second clock signal after the self-excited oscillation is initiated after performing the boosting based on the first clock signal, it is possible to reduce that the tendency of the boosted voltage to decrease and the self-excited oscillation to be stopped.

APPLICATION EXAMPLE 5

In the liquid discharging apparatus according to the application example, the frequency of the modulation signal may be 1 MHz to 8 MHz.

In this case, the driving signal is generated by smoothing the amplification modulation signal, the piezoelectric element is displaced as the driving signal is applied, and liquid is discharged from the nozzle. Here, for example, when the liquid discharging apparatus performs frequency spectrum analysis with respect to a waveform of the driving signal for discharging small dots, it is confirmed that a frequency component which is equal to or greater than 50 kHz is included. In order to generate the driving signal which includes the frequency component which is equal to or greater than 50 kHz, the frequency of the modulation signal (frequency of the self-excited oscillation) is required to be equal to or greater than 1 MHz. If the frequency is lower than 1 MHz, an edge of the waveform of the reproduced driving signal becomes blunt and round. In other words, an angle is rounded and the waveform becomes blunt. When the waveform of the driving signal is blunt, the displacement of the piezoelectric element which is operated in accordance with a rising or falling edge of the waveform becomes gentle, and tailing during the discharge or a discharge defect is generated. Meanwhile, if the frequency of the self-excited oscillation is higher than 8 MHz, resolution of the waveform of the driving signal increases. However, as switching frequency increases in the transistor, a switching loss increases, and compared to linear amplification of a class-AB amplifier or the like, excellent power saving performance and generated heat saving performance are damaged. For this reason, in the liquid discharging apparatus of the above-described application example, it is preferable that the frequency of the modulation signal is 1 MHz to 8 MHz.

APPLICATION EXAMPLE 6

In the liquid discharging apparatus according to the application example, the boosting circuit may be a charge pump circuit.

In this case, since the boosting circuit is the charge pump circuit, there is a possibility of reducing the size, and for example, it is possible to mount the circuit on an integrated circuit device. In addition, since the boosting circuit is configured of the charge pump circuit, compared to a case where the boosting circuit is configured of a switching regulator, it is possible to suppress the generation of noise. Therefore, the influence of noise of the boosting circuit on the driving signal can be further reduced, and a concern about deterioration of the discharge accuracy can be further reduced.

APPLICATION EXAMPLE 7

According to this application example, there is provided a head unit including: a modulation portion which generates a modulation signal pulse-modulated from a source signal; a gate driver which generates an amplification control signal based on the modulation signal; a transistor which generates an amplification modulation signal amplified from the modulation signal based on the amplification control signal; a low pass filter which demodulates the amplification modulation signal and generates a driving signal; a feedback circuit which sends back the driving signal to the modulation portion; a boosting circuit which supplies a voltage which has been boosted based on any one of a first clock signal and a second clock signal to the gate driver; a boosting control portion which controls boosting in the boosting circuit; a piezoelectric element which is displaced as the driving signal is applied; a cavity in which the inside is filled with liquid and an internal volume changes due to the displacement of the piezoelectric element; and a nozzle which communicates with the cavity, and discharges the liquid inside the cavity as liquid droplets in accordance with the change in the internal volume of the cavity, in which the boosting control portion controls the boosting based on the second clock signal after controlling the boosting based on the first clock signal, and in which a switching point of rising or falling of the second clock signal is synchronized with the modulation signal.

In this case, since the switching point of the rising or falling of the second clock signal is synchronized with the modulation signal generated by the self-excited oscillation, it is always possible to set a timing when noise is generated in the boosting circuit close to a desired timing (a timing when the influence of noise is unlikely to occur) in the self-excited oscillation as the boosting circuit performs the boosting based on the second clock signal. Therefore, it is possible to reduce the influence of noise of the boosting circuit on the driving signal, and to reduce the tendency of the discharge accuracy to deteriorate.

In this case, the boosting circuit can perform the boosting based on the first clock signal before the modulation signal is generated by the self-excited oscillation (before the second clock signal is generated). In addition, since the boosting circuit can perform the boosting based on the second clock signal after the second clock signal is generated, it is possible to reduce the tendency of the boosted voltage to decrease and the self-excited oscillation to be stopped.

APPLICATION EXAMPLE 8

According to this application example, there is provided an integrated circuit device for capacitive load driving including: a modulation portion which generates a modulation signal pulse-modulated from a source signal; a gate driver which generates an amplification control signal based on the modulation signal; a boosting circuit which supplies a voltage which has been boosted based on any one of a first clock signal and a second clock signal to the gate driver; and a boosting control portion which controls boosting in the boosting circuit, in which the modulation portion pulse-modulates the source signal, based on a driving signal which is generated by demodulating amplification modulation signal amplified from the modulation signal based on the amplification control signal, in which the boosting control portion controls the boosting based on the second clock signal after controlling the boosting based on the first clock signal, and in which a switching point of rising or falling of the second clock signal is synchronized with the modulation signal.

In this case, since the switching point of the rising or falling of the second clock signal is synchronized with the modulation signal generated by the self-excited oscillation, it is always possible to set a timing when noise is generated in the boosting circuit close to a desired timing (a timing when the influence of noise is unlikely to occur) in the self-excited oscillation as the boosting circuit performs the boosting based on the second clock signal. Therefore, it is possible to reduce the influence of noise of the boosting circuit on the driving signal.

In this case, the boosting circuit can perform the boosting based on the first clock signal before the modulation signal is generated by the self-excited oscillation (before the second clock signal is generated). In addition, since the boosting circuit can perform the boosting based on the second clock signal after the second clock signal is generated, it is possible to reduce the tendency of the boosted voltage to decrease and the self-excited oscillation to be stopped.

In this case, the size of the driving circuit which drives the capacitive load can be reduced as a part thereof is configured of the integrated circuit device for capacitive load driving of the application example.

APPLICATION EXAMPLE 9

According to this application example, there is provided a capacitive load driving circuit including: a modulation portion which generates a modulation signal pulse-modulated from a source signal; a gate driver which generates an amplification control signal based on the modulation signal; a transistor which generates an amplification modulation signal amplified from the modulation signal based on the amplification control signal; a low pass filter which demodulates the amplification modulation signal and generates a driving signal of a capacitive load; a feedback circuit which sends back the driving signal to the modulation portion; a boosting circuit which supplies a voltage which has been boosted based on any one of a first clock signal and a second clock signal to the gate driver; and a boosting control portion which controls boosting in the boosting circuit, in which the boosting control portion controls the boosting based on the second clock signal after controlling the boosting based on the first clock signal, and in which a switching point of rising or falling of the second clock signal is synchronized with the modulation signal.

In this case, since the switching point of the rising or falling of the second clock signal is synchronized with the modulation signal generated by the self-excited oscillation, it is always possible to set a timing when noise is generated in the boosting circuit close to a desired timing (a timing when the influence of noise is unlikely to occur) in the self-excited oscillation as the boosting circuit performs the boosting based on the second clock signal. Therefore, it is possible to reduce the influence of noise of the boosting circuit on the driving signal.

In this case, the boosting circuit can perform the boosting based on the first clock signal before the modulation signal is generated by the self-excited oscillation (before the second clock signal is generated). In addition, since the boosting circuit can perform the boosting based on the second clock signal after the second clock signal is generated, it is possible to reduce that the tendency of the boosted voltage to decrease and the self-excited oscillation to be stopped.

APPLICATION EXAMPLE 10

According to this application example, there is provided a control method of a liquid discharging apparatus which includes a piezoelectric element which is displaced as the driving signal is applied, a cavity in which the inside is filled with liquid and an internal volume changes due to the displacement of the piezoelectric element, and a nozzle which communicates with the cavity, and discharges the liquid inside the cavity as liquid droplets in accordance with the change in the internal volume of the cavity, the method including: generating a boosted voltage based on a second clock signal after controlling the boosting based on a first clock signal; generating a modulation signal pulse-modulated from a source signal based on the driving signal; generating an amplification control signal based on the boosted voltage and the modulation signal; generating an amplification modulation signal amplified from the modulation signal based on the amplification control signal; and generating the driving signal by demodulating the amplification modulation signal, in which a switching point of rising or falling of the second clock signal is synchronized with the modulation signal.

In this case, since the switching point of the rising or falling of the second clock signal is synchronized with the modulation signal generated by the self-excited oscillation, it is always possible to set a timing when noise is generated by the boosting close to a desired timing (a timing when the influence of noise is unlikely to occur) in the self-excited oscillation by generating the boosted voltage based on the second clock signal. Therefore, it is possible to reduce the influence of noise due to the boosting on the driving signal, and to reduce the tendency of the discharge accuracy to deteriorate.

In this case, it is possible to generate the boosted voltage based on the first clock signal before the modulation signal is generated by the self-excited oscillation (before the second clock signal is generated). In addition, since it is possible to generate the boosted voltage based on the second clock signal after the second clock signal is generated, it is possible to reduce the tendency of the boosted voltage to decrease and the self-excited oscillation to be stopped.

BRIEF DESCRIPTION OF THE DRAWINGS

The invention will be described with reference to the accompanying drawings, wherein like numbers reference like elements.

FIG. 6 is a view illustrating a configuration of the selection control portion in the head unit.

FIG. 7 is a view illustrating decoding contents of a decoder in the head unit.

FIG. 14 is a view illustrating an example of a timing chart of the integrated circuit device.

DESCRIPTION OF EXEMPLARY EMBODIMENTS

Hereinafter, an appropriate embodiment of the invention will be described in detail by using the drawings. The drawings used are for convenience of the description. In addition, the embodiment which will be described hereinafter does not inappropriately limit the contents of the invention described within the range of the patent claims. All of the configurations which will be described hereinafter are not necessarily essential configuration requirements of the invention.

1. Outline of Liquid Discharging Apparatus

A printing apparatus which is an example of a liquid discharging apparatus according to the embodiment is an ink jet printer which forms an ink dot group on a printing medium, such as a paper sheet by discharging ink in accordance with image data supplied from an external host computer, and accordingly, prints an image (including characters or figures) which corresponds to the image data.

Examples of the liquid discharging apparatus include a printing apparatus, such as a printer, a color material discharging apparatus which is used in manufacturing a color filter, such as a liquid crystal display, an electrode material discharging apparatus which is used in forming an electrode, such as an organic EL display or a field emission display (FED), and a bio organic material discharging apparatus which is used in manufacturing a bio chip.

Figure 1:
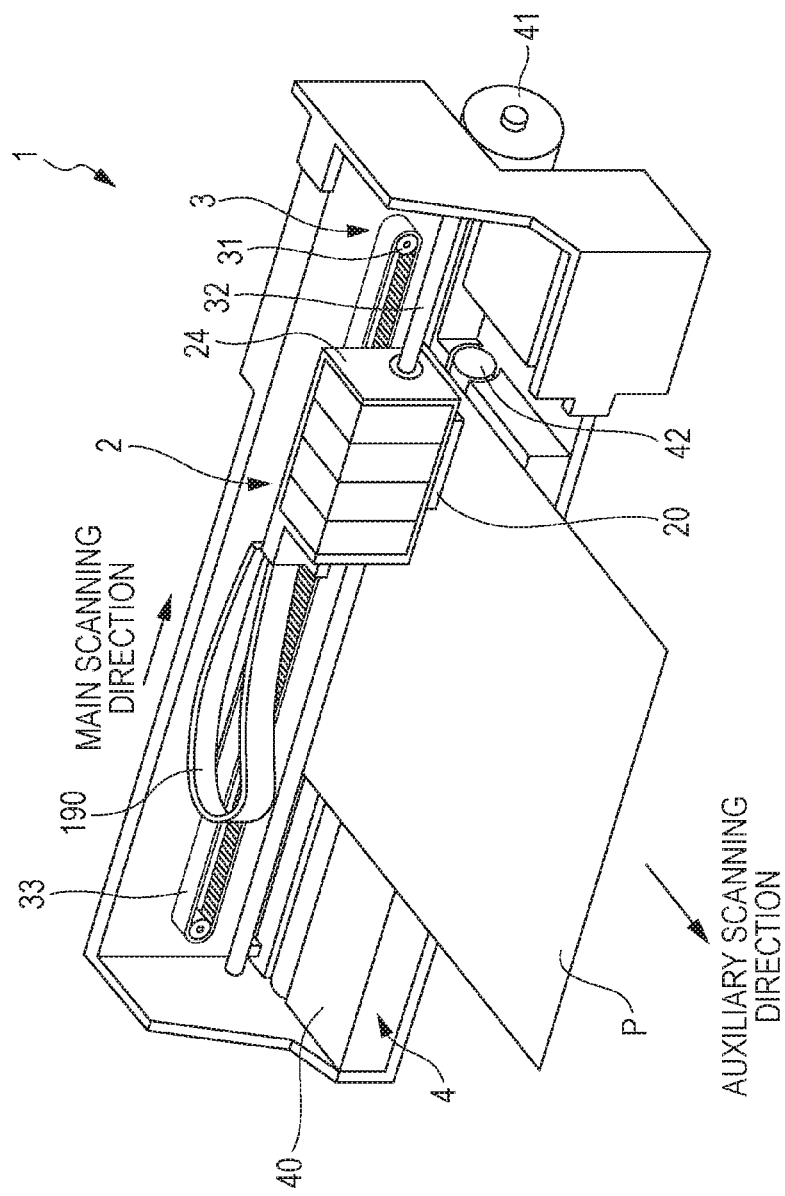
FIG. 1 is a view illustrating a schematic configuration of a liquid discharging apparatus.

FIG. 1 is a perspective view illustrating a schematic configuration of the inside of a liquid discharging apparatus 1. As illustrated in FIG. 1, the liquid discharging apparatus 1 includes a moving mechanism 3 which makes a moving body 2 move (reciprocate) in a main scanning direction.

The moving mechanism 3 includes a carriage motor 31 which is a driving source of the moving body 2, a carriage guide shaft 32 of which both ends are fixed, and a timing belt 33 which extends substantially parallel to the carriage guide shaft 32 and is driven by the carriage motor 31.

A carriage 24 of the moving body 2 is supported to freely reciprocate by the carriage guide shaft 32, and fixed to a part of the timing belt 33. For this reason, when the carriage motor 31 makes the timing belt 33 normally/reversely travel, the moving body 2 is guided to the carriage guide shaft 32 and reciprocates.

In addition, in the moving body 2, a head unit 20 is provided at a part that opposes a printing medium P. As will be described later, the head unit 20 is for discharging ink droplets (liquid droplets) from multiple nozzles, and various types of control signals are supplied thereto via a flexible cable 190.

The liquid discharging apparatus 1 includes a transporting mechanism 4 which transports the printing medium P on a platen 40 in an auxiliary scanning direction. The transporting mechanism 4 includes a transporting motor 41 which is a driving source, and a transporting roller 42 which rotates by the transporting motor 41 and transports the printing medium P in the auxiliary scanning direction.

At a timing when the printing medium P is transported by the transporting mechanism 4, as the head unit 20 discharges the ink droplets onto the printing medium P, an image is formed on a front surface of the printing medium P.

Figure 2:
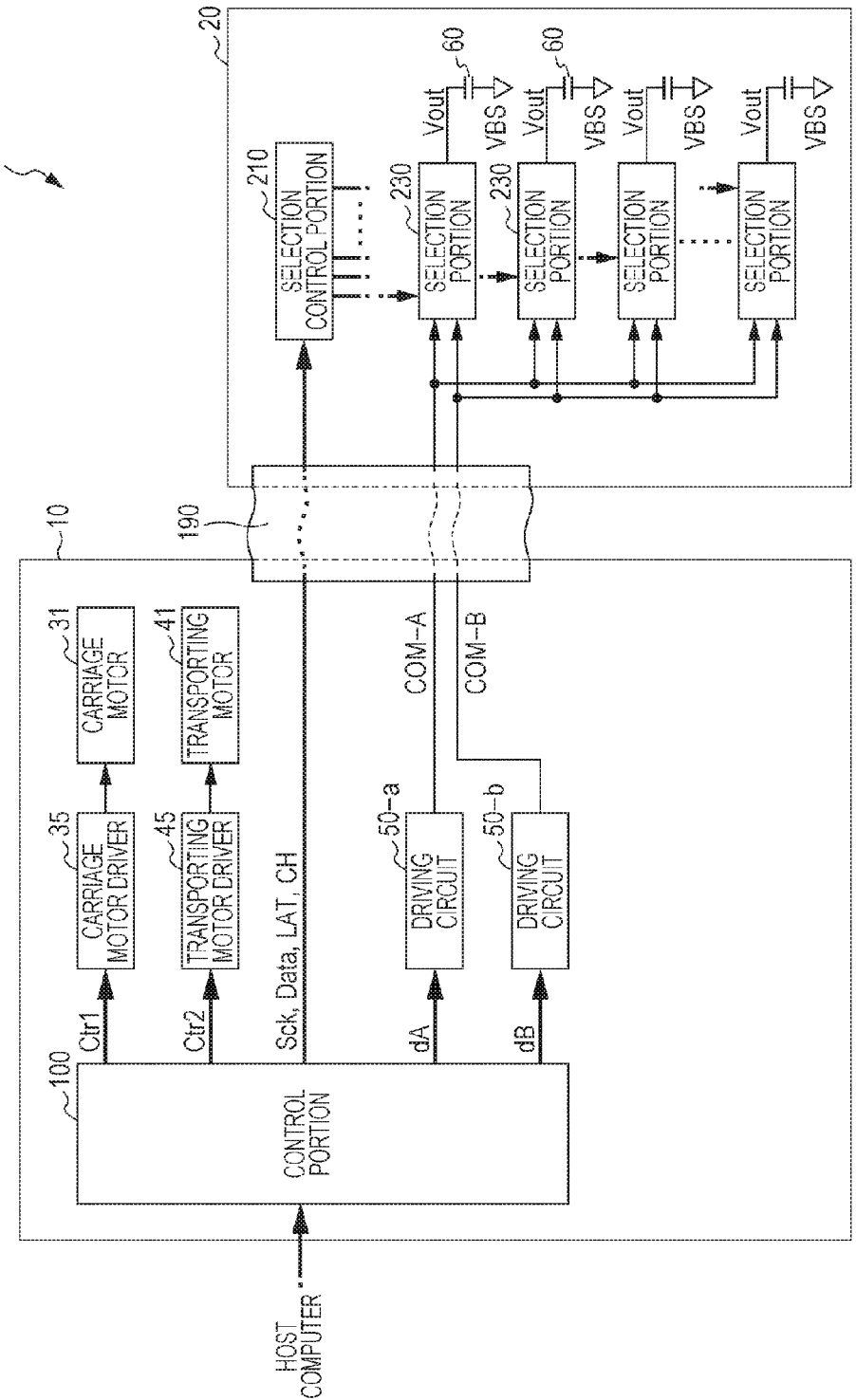
FIG. 2 is a block diagram illustrating a configuration of the liquid discharging apparatus.

FIG. 2 is a block diagram illustrating an electrical configuration of the liquid discharging apparatus 1.

As illustrated in FIG. 2, in the liquid discharging apparatus 1, a control unit 10 and the head unit 20 are connected to each other via the flexible cable 190.

The control unit 10 includes a control portion 100, the carriage motor 31, a carriage motor driver 35, the transporting motor 41, a transporting motor driver 45, a driving circuit 50-$a$, and a driving circuit 50-$b$. Among these, the control portion 100 outputs various types of control signals for controlling each portion when the image data is supplied from the host computer.

Specifically, firstly, the control portion 100 supplies a control signal Ctr1 to the carriage motor driver 35, and the carriage motor driver 35 drives the carriage motor 31 in accordance with the control signal Ctr1. Accordingly, the movement in the main scanning direction in the carriage 24 is controlled.

Secondly, the control portion 100 supplies a control signal Ctr2 to the transporting motor driver 45, and the transporting motor driver 45 drives the transporting motor 41 in accordance with the control signal Ctr2. Accordingly, the movement in the auxiliary scanning direction by the transporting mechanism 4 is controlled.

Thirdly, the control portion 100 supplies digital data dA to one driving circuit 50-*a* and supplies digital data dB to the other driving circuit 50-*b*, among the two driving circuits 50-*a* and 50-*b*. Here, the data dA regulates a waveform of a driving signal COM-A, and the data dB regulates a waveform of a driving signal COM-B, among driving signals supplied to the head unit 20.

In addition, as will be described in detail later, the driving circuit 50-*a* supplies the driving signal COM-A amplified by a class-D amplifier to the head unit 20 after the data dA is analog-converted. Similarly, the driving circuit 50-*b* supplies the driving signal COM-B amplified by the class-D amplifier to the head unit 20 after the data dB is analog-converted. In addition, in the driving circuits 50-*a* and 50-*b*, only the data to be input and the driving signal to be output are different, and the configuration from the viewpoint of the circuit is the same as will be described later. For this reason, when it is not necessary to specify the driving circuits 50-*a* and 50-*b* (for example, when describing FIG. 10 later), the reference numeral after "-" will be omitted, and simply "50" will be used in the description.

Fourthly, the control portion 100 supplies a clock signal Sck, a data signal Data, and control signals LAT and CH, to the head unit 20.

In the head unit 20, a plurality of groups including a selection control portion 210, a selection portion 230, and a piezoelectric element (piezo element) 60, are provided. In addition, the head unit 20 may include the driving circuits 50-*a* and 50-*b*.

The selection control portion 210 instructs each of the selection portions 230 to select or to not select any of the driving signals COM-A and COM-B (or to select none of the signals) by the control signal or the like supplied from the control portion 100, and the selection portion 230 selects the driving signals COM-A and COM-B and supplies the driving signals to each one end of the piezoelectric elements 60 following the instruction of the selection control portion 210. In addition, in FIG. 2, a voltage of the driving signal is expressed as Vout. A voltage VBS is commonly applied to each of the other ends of the piezoelectric elements 60.

The piezoelectric element 60 is displaced as the driving signal is applied. The piezoelectric elements 60 are provided corresponding to each of a plurality of nozzles in the head unit 20. In addition, the piezoelectric elements 60 are displaced in accordance with a difference between the voltage Vout and the voltage VBS of the driving signal selected by the selection portion 230, and discharge the ink. Next, a configuration for discharging the ink by the driving of the piezoelectric element 60 will be simply described.

Figure 3:
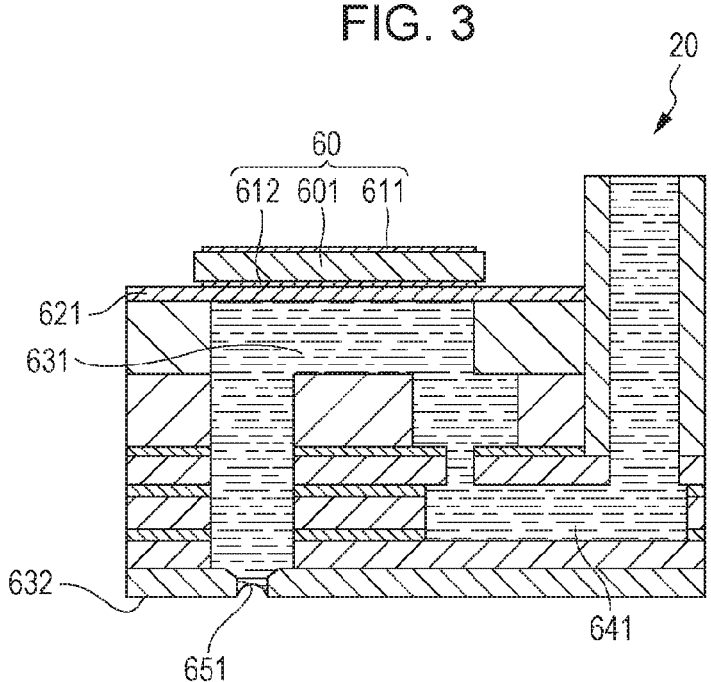
FIG. 3 is a view illustrating a configuration of a discharging portion in a head unit.

FIG. 3 is a view illustrating a schematic configuration which corresponds to one nozzle, in the head unit 20.

As illustrated in FIG. 3, the head unit 20 includes the piezoelectric element 60, a diaphragm 621, a cavity (pressure chamber) 631, a reservoir 641, and a nozzle 651. Among these, the diaphragm 621 functions as a diaphragm which is displaced (bending vibration) by the piezoelectric element 60 provided on an upper surface in the drawing, and enlarges/reduces an internal volume of the cavity 631 which is filled with the ink. The nozzle 651 is an opening portion which is provided on a nozzle plate 632 and communicates with the cavity 631. The cavity 631 is filled with the liquid (for example, the ink), and the internal volume thereof changes by the displacement of the piezoelectric element 60. The nozzle 651 communicates with the cavity 631, and discharges the liquid inside the cavity 631 as the liquid droplets in accordance with the change in the internal volume of the cavity 631.

The piezoelectric element 60 illustrated in FIG. 3 has a structure in which a piezoelectric body 601 is nipped by one pair of electrodes 611 and 612. In a case of the piezoelectric body 601 having such a structure, in accordance with the voltage applied by the electrodes 611 and 612, a center part in FIG. 3 bends in a vertical direction with respect to both end parts together with the electrodes 611 and 612, and the diaphragm 621. Specifically, when the voltage Vout of the driving signal increases, the piezoelectric element 60 bends upwardly, and when the voltage Vout decreases, the piezoelectric element 60 bends downwardly. In this configuration, the ink is drawn out of the reservoir 641 when the piezoelectric element 60 bends upwardly since the internal volume of the cavity 631 is enlarged. Meanwhile, when the piezoelectric element 60 bends downwardly, the internal volume of the cavity 631 is reduced, and thus, the ink is discharged from the nozzle 651 according to the level of the reduction of the volume.

In addition, the piezoelectric element 60 is not limited to the illustrated structure, and may be a type which can discharge the liquid, such as the ink, by deforming the piezoelectric element 60. In addition, the piezoelectric element 60 may be configured to use so-called longitudinal vibration, not being limited to the bending vibration.

In addition, the piezoelectric element 60 is provided corresponding to the cavity 631 and the nozzle 651 in the head unit 20, and the piezoelectric element 60 is provided corresponding to the selection portion 230 in FIG. 1. For this reason, a set of the piezoelectric element 60, the cavity 631, the nozzle 651, and the selection portion 230 is provided in every nozzle 651.

Figure 4A:
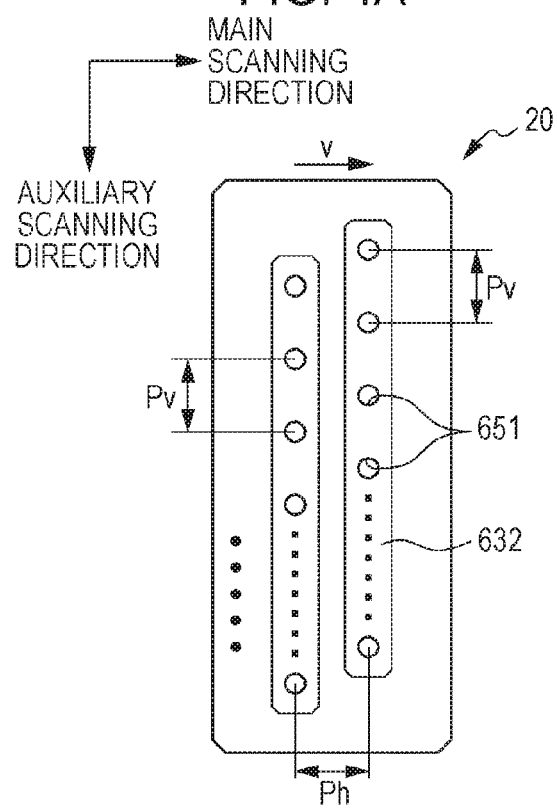
FIGS. 4A and 4B are views illustrating a nozzle arrangement in the head unit.

FIG. 4A is a view illustrating an example of arrangement of the nozzles 651.

As illustrated in FIG. 4A, the nozzles 651 are arranged as follows in two rows, for example. Specifically, while the plurality of nozzles 651 are disposed at a pitch Pv along the auxiliary scanning direction when only one row is viewed, the nozzles 651 have a relationship of being separated by a pitch Ph in the main scanning direction and being shifted only by half of the pitch Pv in the auxiliary scanning direction between the two rows.

In addition, in the nozzles 651, when color printing is performed, patterns which correspond to each color, such as cyan (C), magenta (M), yellow (Y), and black (K), are provided along the main scanning direction, for example. However, in the following description, for simplification, a case where gradation is expressed in a single color will be described.

Figure 4B:
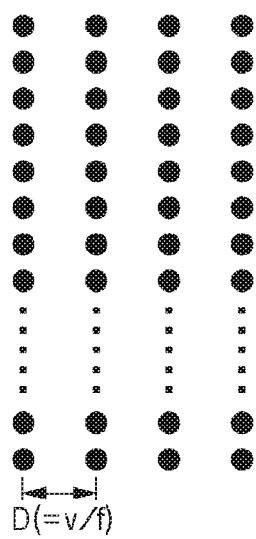

FIG. 4B is a view illustrating a basic resolution of image forming according to the nozzle arrangement illustrated in FIG. 4A. In addition, FIG. 4B is for simplifying the description, and is an example of a method (first method) for forming one dot by discharging the ink droplet one time from the nozzle 651. Black circles illustrate the dots formed as the ink droplets land.

When the head unit 20 moves at a speed v in the main scanning direction, as illustrated in FIG. 4B, an interval D (in the main scanning direction) between the dots, formed by the landing of the ink droplets, and the speed v have the following relationship.

In other words, when one dot is formed by one discharge of the ink droplet, the dot interval D is a value ($=v/f$) which is obtained by dividing the speed v by the discharge frequency f of the ink, that is, the distance by which the head unit 20 moves in a cycle (1/f) during which the ink droplets are repeatedly discharged.

In addition, in the examples of FIGS. 4A and 4B, the pitch Ph has a relationship proportional to the dot interval D by a coefficient n, and the ink droplets discharged from the two rows of the nozzles 651 land to be gathered in the same row on the printing medium P. For this reason, as illustrated in FIG. 4B, the dot interval in the auxiliary scanning direction is half of the dot interval in the main scanning direction. It is needless to say that the dot arrangement is not limited to the illustrated example.

However, in order to realize high speed printing, simply, the speed v at which the head unit 20 moves in the main scanning direction may be increased. However, simply by increasing the speed v, the dot interval D becomes longer. For this reason, in order to realize high speed printing after ensuring a certain level of resolution, it is necessary to increase the discharge frequency f of the ink, and to increase the number of formed dots per unit time.

In addition to the printing speed, in order to improve resolution, the number of formed dots per unit area may be increased. However, in a case where the number of dots is increased, when the amount of the ink is not small, the adjacent dots are combined with each other, and when the discharge frequency f of the ink is not increased, the printing speed deteriorates.

In this manner, in order to realize the high speed printing and the high resolution printing, it is necessary to increase the discharge frequency f of the ink as described above.

Meanwhile, as a method for forming the dots on the printing medium P, in addition to the method for forming one dot by discharging the ink droplet one time, a method (second method) for forming one dot by making it possible to discharge the ink droplets two or more times in a unit period, making one or more ink droplets discharged in the unit period land, and combining one or more landed ink droplets, or a method (third method) for forming two or more dots without combining two or more ink droplets, is employed. In the following description, a case where the dot is formed by the second method will be described.

In the embodiment, a second method will be described as an example as follows. In other words, in the embodiment, regarding one dot, by discharging the ink maximum two times, four gradations, such as a large dot, an intermediate dot, a small dot, and non-recording, are expressed. In order to express the four gradations, in the embodiment, two types of driving signals COM-A and COM-B are prepared, and each of the driving signals has a first-half pattern and a second-half pattern in one cycle. In one cycle, the driving signals COM-A and COM-B in the first-half pattern and the second-half pattern are selected corresponding to the gradation to be expressed (or not selected), and supplied to the piezoelectric element 60.

Here, the driving signals COM-A and COM-B will be described, and then, a configuration for selecting the driving signals COM-A and COM-B will be described. In addition, each of the driving signals COM-A and COM-B is generated by the driving circuit 50, but for convenience, the driving circuit 50 will be described after describing the configuration for selecting the driving signals COM-A and COM-B.

Figure 5:
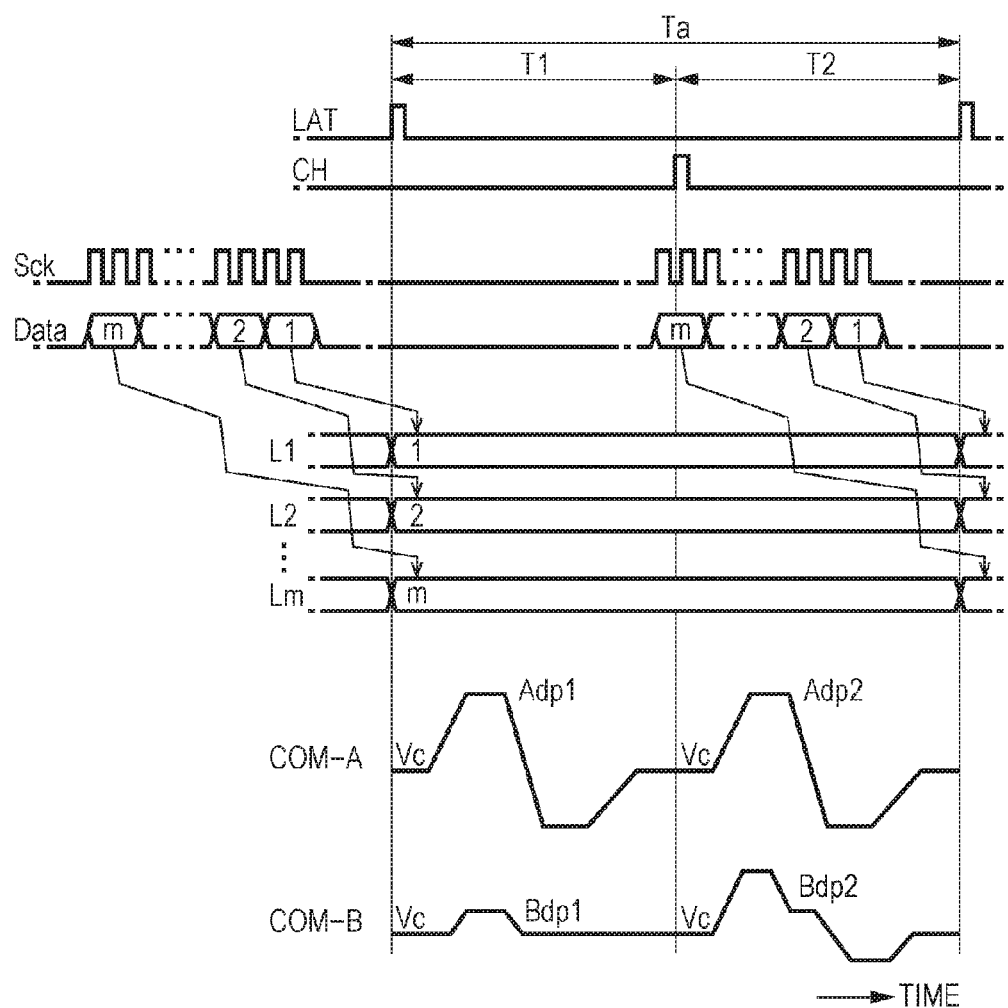
FIG. 5 is a view illustrating an operation of a selection control portion in the head unit.

FIG. 5 is a view illustrating waveforms or the like of the driving signals COM-A and COM-B.

As illustrated in FIG. 5, the driving signal COM-A is a waveform in which a trapezoidal waveform Adp1 which is in a period T1 from the output (rising) of the control signal LAT to the output of the control signal CH in a printing cycle Ta, and a trapezoidal waveform Adp2 which is in a period T2 from the output of the control signal CH to the output of the following control signal LAT in the printing cycle Ta, are continuous.

The trapezoidal waveforms Adp1 and Adp2 in the embodiment have substantially the same shape as each other, and if each of the trapezoidal waveforms is supplied to one end of the piezoelectric element 60, each of the trapezoidal waveforms discharges a predetermined amount, specifically, an approximately intermediate amount of ink from the nozzle 651 corresponding to the piezoelectric element 60.

The driving signal COM-B is a waveform in which a trapezoidal waveform Bdp1 disposed in a period T1 and a trapezoidal waveform Bdp2 disposed in a period T2 are continuous. The trapezoidal waveforms Bdp1 and Bdp2 in the embodiment are waveforms different from each other. Among these, the trapezoidal waveform Bdp1 is a wave for preventing the viscosity of the ink from increasing by micro-vibrating the ink in the vicinity of the opening portion of the nozzle 651. For this reason, even if the trapezoidal waveform Bdp1 is supplied to one end of the piezoelectric element 60, the ink droplets are not discharged from the nozzle 651 corresponding to the piezoelectric element 60. In addition, the trapezoidal waveform Bdp2 is a waveform different from the trapezoidal waveform Adp1 (Adp2). If the trapezoidal waveform Bdp2 is supplied to one end of the piezoelectric element 60, the trapezoidal waveform Bdp2 discharges a smaller amount of ink than the predetermined amount from the nozzle 651 corresponding to the piezoelectric element 60.

In addition, any of a voltage at an initiation timing of the trapezoidal waveforms Adp1, Adp2, Bdp1, and Bdp2, and a voltage at a termination timing, is a common voltage Vc. In other words, each of the trapezoidal waveforms Adp1, Adp2, Bdp1, and Bdp2 is a waveform which is initiated at the voltage Vc and terminated at the voltage Vc.

FIG. 6 is a view illustrating a configuration of the selection control portion 210 in FIG. 2.

As illustrated in FIG. 6, the clock signal Sck, the data signal Data, and the control signals LAT and CH are supplied from the control unit 10 to the selection control portion 210. In the selection control portion 210, a group of a shift register (S/R) 212, a latch circuit 214, and a decoder 216 is provided corresponding to each of the piezoelectric elements 60 (nozzles 651).

When forming one dot of the image, the data signal Data regulates the size of the dot. In the embodiment, in order to express four gradations, such as non-recording, a small dot, an intermediate dot, and a large dot, the data signal Data is configured of 2 bits including a high-order bit (MSB) and a low-order bit (LSB).

The data signal Data is serially supplied from the control portion 100 in accordance with main scanning of the head unit 20 to each nozzle being synchronized with the clock signal Sck. A configuration for holding the data signal Data which is serially supplied by 2 bits corresponding to the nozzle is the shift register 212.

Specifically, the shift registers 212 in which the number of stages corresponds to the piezoelectric elements (nozzles) are continuously connected to each other, and the data signal Data which is serially supplied is transferred to the following stage in accordance with the clock signal Sck.

In addition, when the number of piezoelectric elements 60 is m (m is a plural number), in order to distinguish the shift registers 212, the stages are written as a first stage, a second stage, ... , an m stage in order from an upstream side in which the data signal Data is supplied.

The latch circuit 214 latches the data signal Data held by the shift register 212 at the rise of the control signal LAT.

The decoder 216 decodes the 2-bit data signal Data which is latched by the latch circuit 214, outputs selected signals Sa and Sb in each of the periods T1 and T2 according to the regulation of the control signal LAT and the control signal CH, and regulates the selection by the selection portion 230.

FIG. 7 is a view illustrating decoding contents in the decoder 216.

In FIG. 7, the latched 2-bit data signal Data is written as (MSB, LSB). A case where the latched data signal Data is (0, 1), for example, means that the decoder 216 performs the output by setting each of logic levels of the selected signals Sa and Sb to be at H and L levels in the period T1, and to be at L and H levels in the period T2.

In addition, the logic levels of the selected signals Sa and Sb are level-shifted to a high amplitude logic by a level shifter (not illustrated) from the logic levels of the clock signal Sck, the data signal Data, and the control signals LAT and CH.

Figure 8:
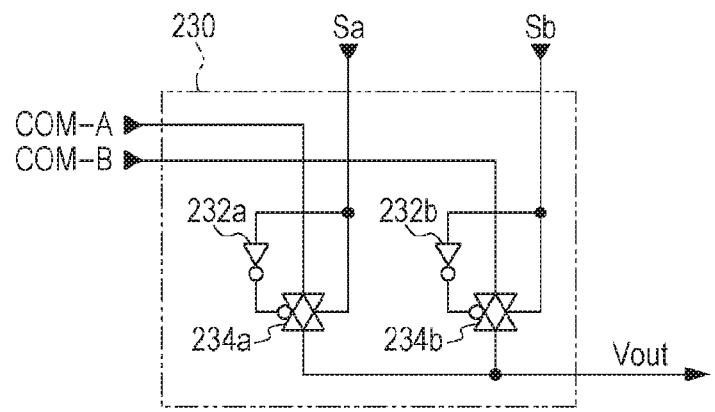
FIG. 8 is a view illustrating a configuration of a selection portion in the head unit.

FIG. 8 is a view illustrating a configuration of the selection portion 230 corresponding to one piezoelectric element 60 (nozzle 651) in FIG. 2.

As illustrated in FIG. 8, the selection portion 230 includes inverters (NOT circuits) 232a and 232b, and transfer gates 234a and 234b.

While the selected signal Sa from the decoder 216 is supplied to a positive control end to which the circle is not attached in the transfer gate 234a, the selected signal Sa is logic-inverted by the inverter 232a and supplied to a negative control end to which the circle is attached in the transfer gate 234a. Similarly, while the selected signal Sb is supplied to a positive control end of the transfer gate 234b, the selected signal Sb is logic-inverted by the inverter 232b and supplied to a negative control end of the transfer gate 234b.

The driving signal COM-A is supplied to an input end of the transfer gate 234a, and the driving signal COM-B is supplied to an input end of the transfer gate 234b. Both output ends of the transfer gates 234a and 234b are commonly connected to each other, and connected to one end of the corresponding piezoelectric element 60.

If the selected signal Sa is at the H level, the transfer gate 234a is conducted (ON) between the input end and the output end, and if the selected signal Sa is at the L level, the transfer gate 234a is non-conducted (OFF) between the input end and the output end. Similarly, the transfer gate 234b is turned ON and OFF between the input end and the output end corresponding to the selected signal Sb.

Next, operations of the selection control portion 210 and the selection portion 230 will be described with reference to FIG. 5.

The data signal Data is synchronized with the clock signal Sck and serially supplied in each nozzle from the control portion 100, and transferred in order in the shift register 212 corresponding to the nozzle. In addition, when the control portion 100 stops the supply of the clock signal Sck, the data signal Data which corresponds to the nozzle are held in each of the shift registers 212. In addition, the data signal Data is supplied in order which corresponds to the nozzles on the final m stage, ... , the second stage, and the first stage in a shift register 222.

Here, when the control signal LAT rises, each of the latch circuits 214 simultaneously latches the data signal Data held in the shift register 212. In FIG. 5, L1, L2, ... , Lm illustrate the data signal Data which is latched by the latch circuit 214 corresponding to the shift register 212 on the first stage, the second stage, and the m stage.

The decoder 216 outputs the logic levels of the selected signals Sa and Sb as the contents illustrated in FIG. 7 in each of the periods T1 and T2 in accordance with the size of the dots regulated by the latched data signal Data.

In other words, firstly, when the data signal Data is (1, 1) and regulates the size of the large dot, the decoder 216 sets the selected signals Sa and Sb to the H and L levels in the period T1, and to the H and L levels even in the period T2. Secondly, when the data signal Data is (0, 1) and regulates the size of the intermediate dot, the decoder 216 sets the selected signals Sa and Sb to the H and L levels in the period T1, and to the L and H levels in the period T2. Thirdly, when the data signal Data is (1, 0) and regulates the size of the small dot, the decoder 216 sets the selected signals Sa and Sb to the L and L levels in the period T1, and to the L and H levels in the period T2. Fourthly, when the data signal Data is (0, 0) and regulates non-recording, the decoder 216 sets the selected signals Sa and Sb to the L and H levels in the period T1, and to the L and L levels in the period T2.

Figure 9:
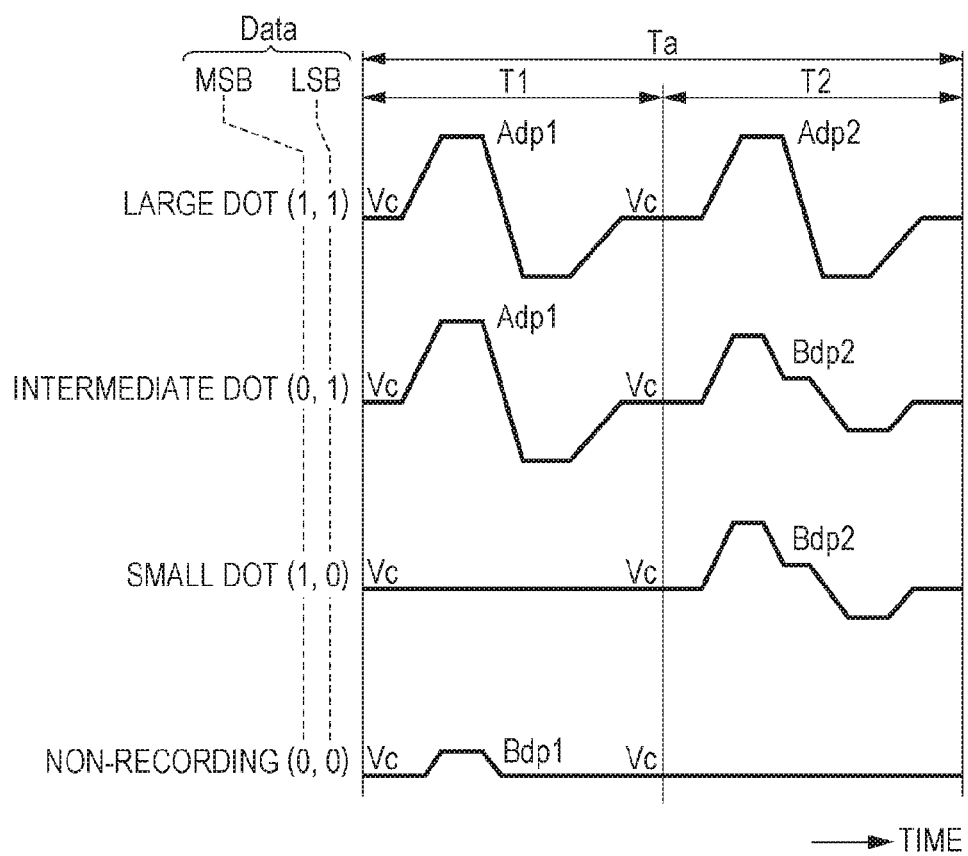
FIG. 9 is a view illustrating a driving signal selected by the selection portion.

FIG. 9 is a view illustrating a piezoelectric waveform of the driving signal selected in accordance with the data signal Data and supplied to one end of the piezoelectric element 60.

When the data signal Data is (1, 1), since the selected signals Sa and Sb become the H and L levels in the period T1, the transfer gate 234a becomes ON and the transfer gate 234b becomes OFF. For this reason, the trapezoidal waveform Adp1 of the driving signal COM-A is selected in the period T1. Since the selected signals Sa and Sb become the H and L levels even in the period T2, the selection portion 230 selects the trapezoidal waveform Adp2 of the driving signal COM-A.

In this manner, when the trapezoidal waveform Adp1 is selected in the period T1, the trapezoidal waveform Adp2 is selected in the period T2, and the waveforms are supplied to one end of the piezoelectric element 60 as the driving signal, an approximately intermediate amount of ink is discharged being divided into 2 times from the nozzle 651 which corresponds to the piezoelectric element 60. For this reason, each drop of ink lands and is integrated as one drop on the printing medium P, and consequentially, the large dot according to the regulation of the data signal Data is formed.

When the data signal Data is (0, 1), since the selected signals Sa and Sb become the H and L levels in the period T1, the transfer gate 234a becomes ON and the transfer gate 234b becomes OFF. For this reason, the trapezoidal waveform Adp1 of the driving signal COM-A is selected in the period T1. Then, since the selected signals Sa and Sb become the L and H levels in the period T2, the trapezoidal waveform Bdp2 of the driving signal COM-B is selected.

Therefore, an intermediate amount and a small amount of ink are discharged being divided into 2 times from the nozzle. For this reason, each drop of ink lands and is integrated as one drop on the printing medium P, and consequentially, the intermediate dot according to the regulation of the data signal Data is formed.

When the data signal Data is (1, 0), since the selected signals Sa and Sb become the L level in the period T1, the transfer gates 234a and 234b become OFF. For this reason, none of the trapezoidal waveforms Adp1 and Bdp1 is selected in the period T1. When both the transfer gates 234a and 234b are OFF, a route from a connection point between the output ends of the transfer gates 234a and 234b to one end of the piezoelectric element 60 becomes a high impedance state of not being electrically connected to any part. However, the piezoelectric element 60 holds a voltage (Vc-VBS) immediately before the transfer gates 234*a* and 234*b* become OFF due to capacitive characteristics thereof.

Next, since the selected signals Sa and Sb become the L and H levels in the period T2, the trapezoidal waveform Bdp2 of the driving signal COM-B is selected. For this reason, since an approximately small amount of ink is discharged from the nozzle 651 only in the period T2, the small dot according to the regulation of the data signal Data is formed on the printing medium P.

When the data signal Data is (0, 0), since the selected signals Sa and Sb become the L and H levels in the period T1, the transfer gate 234*a* becomes OFF and the transfer gate 234*b* becomes ON. For this reason, the trapezoidal waveform Bdp1 of the driving signal COM-B is selected in the period T1. Then, since both the selected signals Sa and Sb become the L level in the period T2, none of the trapezoidal waveforms Adp2 and Bdp2 is selected.

For this reason, since the ink in the vicinity of the opening portion of the nozzle 651 only micro-vibrates in the period T1 and the ink is not discharged, consequentially, the dot is not formed, that is, non-recording according to the regulation of the data signal Data is performed.

In this manner, the selection portion 230 selects (or does not select) the driving signals COM-A and COM-B following the instruction by the selection control portion 210, and supplies the driving signals to one end of the piezoelectric element 60. For this reason, each piezoelectric element 60 is driven in accordance with the size of the dots regulated by the data signal Data.

In addition, the driving signals COM-A and COM-B illustrated in FIG. 5 are merely examples. In reality, in accordance with a moving speed of the head unit 20 or properties of the printing medium P, combination of various waveforms prepared in advance is used.

In addition, here, the piezoelectric element 60 is described in an example in which the piezoelectric element 60 bends upwardly according to the rise of the voltage, but when the voltage supplied to the electrodes 611 and 612 is reversed, the piezoelectric element 60 bends downwardly according to the rise of the voltage. For this reason, in a configuration in which the piezoelectric element 60 bends downward according to the rise of the voltage, the driving signals COM-A and COM-B illustrated in FIG. 9 become waveforms reversed in accordance with the voltage Vc.

In this manner, in the embodiment, one dot is formed by considering the cycle Ta which is a unit period as a unit period on the printing medium P. For this reason, in the embodiment in which one dot is formed by (maximum) 2 times of the discharges of the ink droplets in the cycle Ta, the discharge frequency f of the ink becomes 2/Ta, and the dot interval D becomes a value which is obtained by dividing the speed v at which the head unit 20 moves by the discharge frequency f (=2/Ta) of the ink.

In general, when the ink droplets can be discharged Q (Q is an integer which is equal to or greater than 2) times in a unit period T, and one dot is formed by Q times of the discharges of the ink droplets, the discharge frequency f of the ink can be expressed as Q/T.

As described in the embodiment, in a case where dots having different sizes are formed on the printing medium P, it is necessary to shorten the time for one time of discharge of the ink droplet even when the time (cycle) for forming one dot is the same, compared to a case where one dot is formed by one time of discharge of the ink droplet.

In addition, specific description of the third method for forming two or more dots without combining two or more ink droplets is not necessary.

2. Circuit Configuration of Driving Circuit

Next, the driving circuits 50-*a* and 50-*b* will be described. Among these, when summarizing one driving circuit 50-*a*, the driving signal COM-A is generated as follows. In other words, firstly, the driving circuit 50-*a* analog-converts the data dA supplied from the control portion 100, secondly, the driving circuit 50-*a* sends back the driving signal COM-A of the output, corrects a deviation between a signal (attenuation signal) and a target signal based on the driving signal COM-A by a high frequency component of the driving signal COM-A, and generates the modulation signal according to the corrected signal, thirdly, the driving circuit 50-*a* generates an amplification modulation signal by switching the transistor according to the modulation signal, and fourthly, the driving circuit 50-*a* smoothes (demodulates) the amplification modulation signal by a low pass filter, and outputs the smoothed signal as the driving signal COM-A.

The other driving circuit 50-*b* also has a similar configuration, and is different only in that the driving signal COM-B is output from the data dB. Here, in the following FIG. 10, a driving circuit 50 will be described without distinguishing the driving circuits 50-*a* and 50-*b*.

However, the input data and output driving signal are written as dA (dB) or COM-A (COM-B). The driving circuit 50-*a* illustrates that the data dA is input and the driving signal COM-A is output, and the driving circuit 50-*b* illustrates that the data dB is input and the driving signal COM-B is output.

Figure 10:
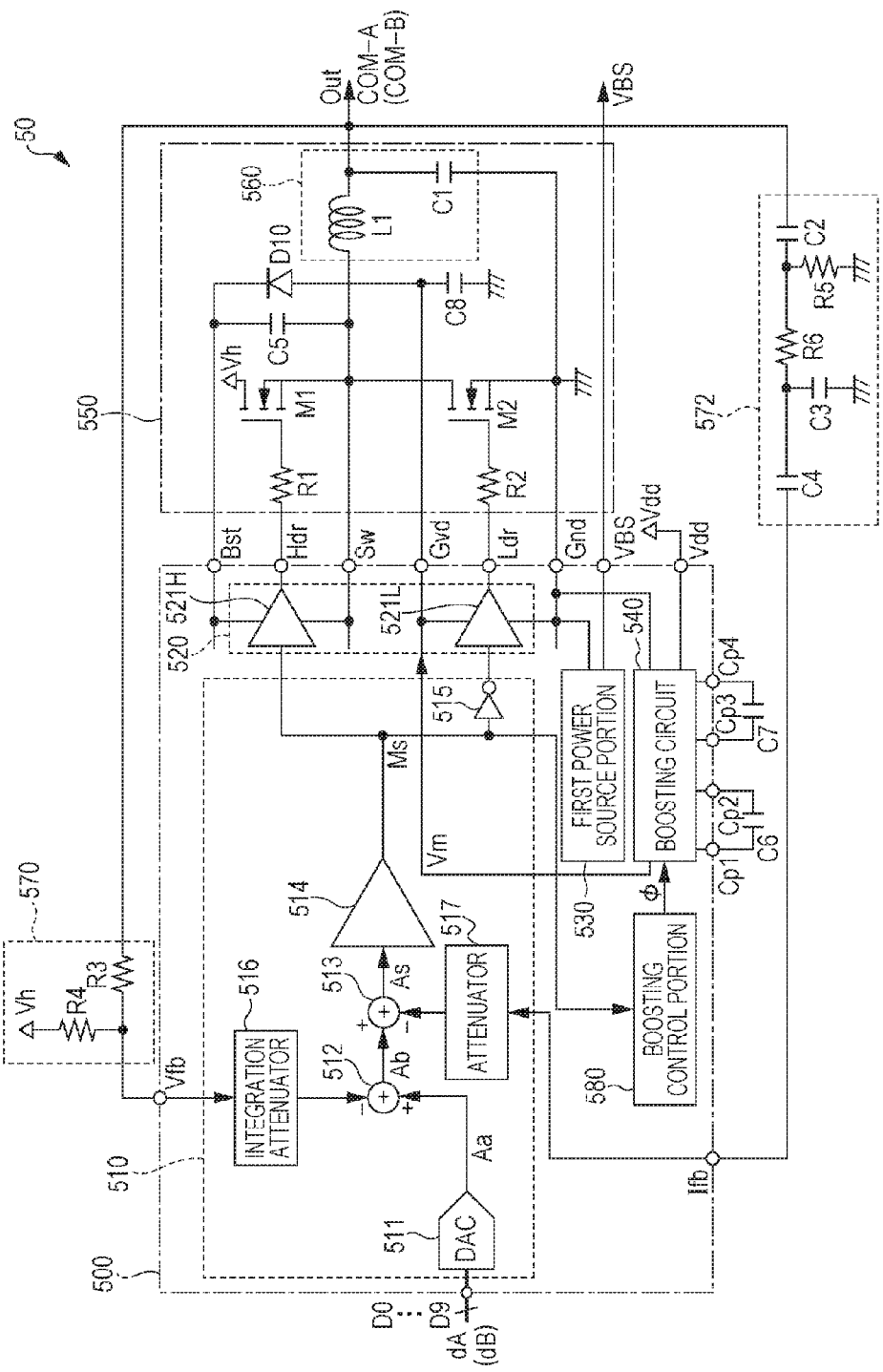
FIG. 10 is a view illustrating a circuit configuration of a driving circuit (capacitive load driving circuit).

FIG. 10 is a view illustrating a circuit configuration of the driving circuit (capacitive load driving circuit) 50.

In addition, in FIG. 10, a configuration for outputting the driving signal COM-A is illustrated, but in reality, in an integrated circuit device 500, a circuit which generates both the driving signals COM-A and COM-B of two systems is in one package.

As illustrated in FIG. 10, the driving circuit 50 is configured of various elements, such as a resistor or a capacitor, in addition to the integrated circuit device (integrated circuit device for capacitive load driving) 500 and an output circuit 550.

The driving circuit 50 in the embodiment includes a modulation portion 510 which generates a modulation signal pulse-modulated from a source signal; a gate driver 520 which generates an amplification control signal based on the modulation signal; a transistor (a first transistor M1 and a second transistor M2) which generates an amplification modulation signal amplified from the modulation signal based on the amplification control signal; a low pass filter 560 which demodulates the amplification modulation signal and generates a driving signal; a feedback circuit (a first feedback circuit 570 and a second feedback circuit 572) which sends back the driving signal to the modulation portion 510; a boosting circuit 540; and a boosting control portion 580 which controls the boosting circuit 540. In addition, the driving circuit 50 may include a first power source portion 530 which applies a signal to a terminal that is different from a terminal to which the driving signal of the piezoelectric element 60 is applied.

The integrated circuit device 500 in the embodiment includes the modulation portion 510 and the gate driver 520.

Based on the 10-bit data dA (source signal) input from the control portion 100 via terminals D0 to D9, the integrated circuit device 500 outputs gate signals (amplification control signals) to each of the first transistor M1 and the second transistor M2. For this reason, the integrated circuit device 500 includes a digital to analog converter (DAC) 511, an adder 512, an adder 513, a comparator 514, an integration attenuator 516, an attenuator 517, an inverter 515, a first gate driver 521H, a second gate driver 521L, the first power source portion 530, the boosting circuit 540, and the boosting control portion 580.

The DAC 511 converts the data dA which regulates the waveform of the driving signal COM-A into an original driving signal Aa, and supplies the signal to the input end (+) of the adder 512. In addition, a voltage amplitude of the original driving signal Aa is, for example, 1 V to 2 V, and the amplified voltage becomes the driving signal COM-A. In other words, the original driving signal Aa is a signal to be a target before the amplification of the driving signal COM-A.

The integration attenuator 516 attenuates a voltage of a terminal Out input via a terminal Vfb, that is, the driving signal COM-A, integrates the voltage, and supplies the voltage to the input end (−) of the adder 512.

The adder 512 supplies a signal Ab of a voltage integrated by subtracting the voltage of the input end (−) from the voltage of the input end (+), to the input end (+) of the adder 513.

In addition, a power source voltage of a circuit which reaches the inverter 515 from the DAC 511 is 3.3 V (voltage Vdd supplied from a power source terminal Vdd) having a low amplitude. For this reason, while the voltage of the original driving signal Aa is approximately maximum 2 V, there is a case where the voltage of the driving signal COM-A exceeds maximum 40 V. Therefore, in order to match amplitude ranges of both voltages when acquiring the deviation, the voltage of the driving signal COM-A is attenuated by the integration attenuator 516.

The attenuator 517 attenuates the high frequency component of the driving signal COM-A input via a terminal Ifb, and supplies the component to the input end (−) of the adder 513. The adder 513 supplies a signal As of the voltage which is obtained by subtracting the voltage of the input end (−) from the voltage of the input end (+) to the comparator 514. The attenuation by the attenuator 517 is for matching the amplitude when sending back the driving signal COM-A, similarly to the integration attenuator 516.

The voltage of the signal As output from the adder 513 is a voltage which is obtained by deducting the attenuated voltage of the signal supplied to the terminal Vfb and subtracting the attenuated voltage of the signal supplied to the terminal Ifb, from the voltage of the original driving signal Aa. For this reason, the voltage of the signal As by the adder 513 can be a signal which is obtained by correcting a deviation obtained by deducting the attenuated voltage of the driving signal COM-A output from the terminal Out, from the voltage of the original driving signal Aa which is a target, by the high frequency component of the driving signal COM-A.

The comparator 514 outputs a modulation signal Ms pulse-modulated as follows based on the voltage attenuated by the adder 513. Specifically, the comparator 514 outputs the modulation signal Ms which becomes the H level when the voltage becomes equal to or greater than a voltage threshold value Vth1 if the voltage of the signal As output from the adder 513 is rising, and becomes the L level when the voltage is lower than a voltage threshold value Vth2 if the voltage of the signal As is lowering. In addition, as will be described later, the voltage threshold values are set to have a relationship of Vth1>Vth2.

The modulation signal Ms by the comparator 514 is supplied to the second gate driver 521L through the logic inversion by the inverter 515. Meanwhile, the modulation signal Ms is supplied to the first gate driver 521H without the logic inversion. For this reason, the logic levels supplied to the first gate driver 521H and the second gate driver 521L have an exclusive relationship from each other.

In reality, the timing of the logic levels supplied to the first gate driver 521H and the second gate driver 521L may be controlled so that both logic levels do not become the H level at the same time (so that the first transistor M1 and the second transistor M2 do not become ON at the same time). For this reason, strictly speaking, the exclusive relationship described here means that both logic levels do not become the H level at the same time (the first transistor M1 and the second transistor M2 do not become ON at the same time).

However, the modulation signal described here is the modulation signal Ms in a narrow sense, but when considering that the modulation signal is a signal pulse-modulated in accordance with the original driving signal Aa, a negative signal of the modulation signal Ms is also included in the modulation signal. In other words, the modulation signal pulse-modulated in accordance with the original driving signal Aa includes not only the modulation signal Ms, but also the signal in which the logic level of the modulation signal Ms is inverted or the signal in which the timing is controlled.

In addition, since the comparator 514 outputs the modulation signal Ms, the circuit which reaches the comparator 514 or the inverter 515, that is, the DAC 511, the adder 512, the adder 513, the comparator 514, the inverter 515, the integration attenuator 516, and the attenuator 517 correspond to the modulation portion 510 which generates the modulation signal.

In addition, in the configuration illustrated in FIG. 10, the digital data dA is converted into the original driving signal Aa by the DAC 511, but, for example, the original driving signal Aa from an external circuit may be supplied following the instruction by the control portion 100, not via the DAC 511. In both cases of the data dA and the original driving signal Aa, since the target value when generating the waveform of the driving signal COM-A is regulated, there is no change in that the signal is the source signal.

The first gate driver 521H level-shifts a low logic amplitude which is an output signal of the comparator 514 to a high logic amplitude, and outputs the high logic amplitude from a terminal Hdr. In the power source voltage of the first gate driver 521H, a high-order side is a voltage applied via a terminal Bst, and a low-order side is a voltage applied via a terminal Sw. The terminal Bst is connected to one end of a capacitor C5 and a cathode electrode of a diode D10 for preventing a backflow. The terminal Sw is connected to a source electrode in the first transistor M1, a drain electrode in the second transistor M2, the other end of the capacitor C5, and one end of an inductor L1. An anode electrode of the diode D10 is connected to a terminal Gvd and one end of a capacitor C8, and a voltage Vm (for example, 7.5 V) output by a boosting circuit 340 is applied thereto. Therefore, a potential difference between the terminal Bst and the terminal Sw is substantially equivalent to a potential difference between both ends of the capacitor C5, that is, the voltage Vm (for example, 7.5 V).

The second gate driver 521L is operated on a side having a lower potential than that of the first gate driver 521H. The second gate driver 521L level-shifts the low logic amplitude (L level: 0 V, H level: 3.3 V) which is an output signal of the inverter 515 to the high logic amplitude (for example, L level: 0 V, H level: 7.5 V), and outputs the high logic amplitude from a terminal Ldr. In the power source voltage of the second gate driver 521L, the voltage Vm (for example, 7.5 V) is applied as a high-order side, and a zero voltage is applied via a ground terminal Gnd as a low-order side. In other words, the ground terminal Gnd is grounded. In addition, the terminal Gvd is connected to the anode electrode of the diode D10.

The first transistor M1 and the second transistor M2 are, for example, N channel type field effect transistors (FET). Among these, in the high-side first transistor M1, a voltage Vh (for example, 42 V) is applied to the drain electrode, and a gate electrode is connected to the terminal Hdr via a resistor R1. In the low-side second transistor M2, a gate electrode is connected to the terminal Ldr via a resistor R2, and a source electrode is grounded.

Therefore, when the first transistor M1 is OFF and the second transistor M2 is ON, the voltage of the terminal Sw becomes 0 V, and the voltage Vm (for example, 7.5 V) is applied to the terminal Bst. Meanwhile, when the first transistor M1 is ON and the second transistor M2 is OFF, Vh (for example, 42 V) is applied to the terminal Sw, and Vh+Vm (for example, 49.5 V) is applied to the terminal Bst.

In other words, since a reference potential (potential of the terminal Sw) changes to 0 V or Vh (for example, 42 V) in accordance with the operations of the first transistor M1 and the second transistor M2 by using the capacitor C5 as a floating power source, the first gate driver 521H outputs an amplification control signal in which the L level is close to 0 V and the H level is close to Vm (for example, 7.5 V), or the L level is close to Vh (for example, 42 V) and the H level is close to Vh+Vm (for example, 49.5 V). In contrast to this, since a reference potential (potential of the terminal Gnd) is fixed to 0 V regardless of the operations of the first transistor M1 and the second transistor M2, the second gate driver 521L outputs an amplification control signal in which the L level is close to 0 V and the H level is close to Vm (for example, 7.5 V).

The other end of the inductor L1 is the terminal Out which performs the output in the driving circuit 50, and the driving signal COM-A from the terminal Out is supplied to the head unit 20 via the flexible cable 190 (refer to FIGS. 1 and 2).

The terminal Out is connected to each of one end of a capacitor C1, one end of a capacitor C2, and one end of a resistor R3. Here, the other end of the capacitor C1 is grounded. For this reason, the inductor L1 and the capacitor C1 function as low pass filters (LPF) which smooth the amplification modulation signal that appears at a connection point between the first transistor M1 and the second transistor M2.

The other end of the resistor R3 is connected to the terminal Vfb and one end of a resistor R4, and the voltage Vh is applied to the other end of the resistor R4. Accordingly, the driving signal COM-A which passes through the first feedback circuit 570 (a circuit configured of the resistor R3 and the resistor R4) from the terminal Out is pulled up and sent back to the terminal Vfb.

Meanwhile, the other end of the capacitor C2 is connected to one end of a resistor R5 and one end of a resistor R6. Here, the other end of the resistor R5 is grounded. For this reason, the capacitor C2 and the resistor R5 function as high pass filters which allow the high frequency component in which the frequency is equal to or higher than cutoff frequency to pass through, in the driving signal COM-A from the terminal Out. In addition, the cutoff frequency of the high pass filter is set to approximately 9 MHz, for example.

In addition, the other end of the resistor R6 is connected to one end of a capacitor C4 and one end of a capacitor C3. Here, the other end of the capacitor C3 is grounded. For this reason, the resistor R6 and the capacitor C3 function as low pass filters which allow a low frequency component in which the frequency is equal to or lower than the cutoff frequency to pass through, in a signal component that passes through the high pass filter. In addition, the cutoff frequency of the LPF is set to approximately 160 MHz, for example.

Since the cutoff frequency of the high pass filter is set to be lower than the cutoff frequency of the low pass filter, the high pass filter and the low pass filter function as a band pass filter which allows the high frequency component within a range of a predetermined frequency to pass through, in the driving signal COM-A.

The other end of the capacitor C4 is connected to the terminal Ifb of the integrated circuit device 500. Accordingly, among the high frequency components of the driving signal COM-A which pass through the second feedback circuit 572 (a circuit configured of the capacitor C2, the resistor R5, the resistor R6, the capacitor C3, and the capacitor C4) that functions as the band pass filter, a DC component is cut and sent back to the terminal Ifb.

However, the driving signal COM-A output from the terminal Out is a signal which smoothes the amplification modulation signal at the connection point (terminal Sw) between the first transistor M1 and the second transistor M2 by using the low pass filter configured of the inductor L1 and the capacitor C1. Since the driving signal COM-A is sent back to the adder 512 after being integrated and subtracted via the terminal Vfb, the feedback is delayed (a sum of a delay due to smoothing of the inductor L1 and the capacitor C1 and a delay due to the integration attenuator 516), and self-excited oscillation is performed at the frequency determined by the feedback transmission relationship.

However, since the amount of delay of a feedback path via the terminal Vfb is large, there is a case where it is not possible to increase the frequency of the self-excited oscillation to be high enough to make it possible to ensure sufficient accuracy of the driving signal COM-A only by the feedback via the terminal Vfb.

Here, in the embodiment, by providing a path for sending back the high frequency component of the driving signal COM-A via the terminal Ifb in addition to the path via the terminal Vfb, the delay in the entire circuit is reduced. For this reason, the frequency of the signal As which is obtained by adding the high frequency component of the driving signal COM-A to the signal Ab becomes high enough to make it possible to ensure sufficient accuracy of the driving signal COM-A, compared to a case where the path via the terminal Ifb is not provided.

Figure 11:
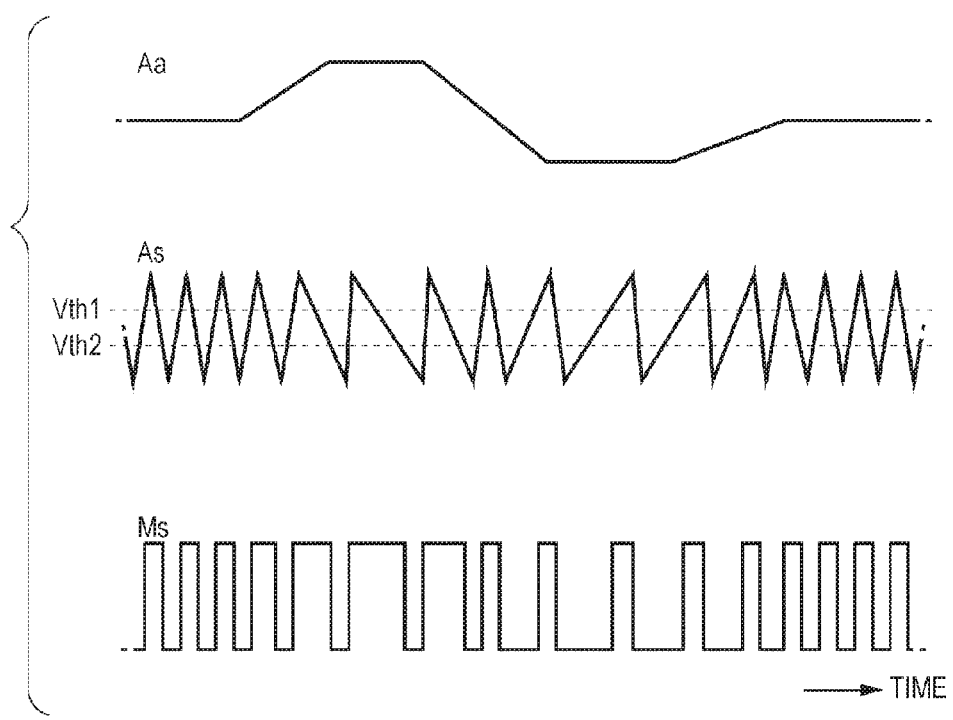
FIG. 11 is a view illustrating an operation of the driving circuit.

FIG. 11 is a view illustrating waveforms of the signal As and the modulation signal Ms in association with a waveform of the original driving signal Aa.

As illustrated in FIG. 11, the signal As is a triangular waveform, and the oscillation frequency thereof changes in accordance with the voltage (input voltage) of the original driving signal Aa. Specifically, the oscillation frequency becomes the highest when the input voltage is an intermediate value, and decreases as the input voltage increases or decreases from the intermediate value.

In addition, when the input voltage is close to the intermediate value, an inclination of the triangular waveform in the signal As becomes substantially equivalent on upward (increasing of the voltage) and downward (decreasing of the voltage) inclination. For this reason, a duty ratio of the modulation signal Ms which is a result of comparison of the signal As with the voltage threshold values Vth1 and Vth2 by the comparator 514 is substantially 50%. When the input voltage increases from the intermediate value, the downward inclination of the signal As becomes gentle. For this reason, the period during which the modulation signal Ms becomes the H level becomes relatively longer, and the duty ratio becomes larger. Meanwhile, as the input voltage decreases from the intermediate value, the upward inclination of the signal As becomes gentle. For this reason, the period during which the modulation signal Ms becomes the H level becomes relatively shorter, and the duty ratio becomes smaller.

For this reason, the modulation signal Ms becomes a pulse density modulation signal as follows. In other words, the duty ratio of the modulation signal Ms is substantially 50% when the input voltage is the intermediate value, increases as the input voltage becomes higher than the intermediate value, and decreases as the input voltage becomes lower than the intermediate value.

The first gate driver 521H makes the first transistor M1 ON/OFF based on the modulation signal Ms. In other words, the first gate driver 521H makes the first transistor M1 ON when the modulation signal Ms is the H level, and makes the first transistor M1 OFF when the modulation signal Ms is the L level. The second gate driver 521L makes the second transistor M2 ON/OFF based on a logic inversion signal of the modulation signal Ms. In other words, the second gate driver 521L makes the second transistor M2 OFF when the modulation signal Ms is the H level, and makes the second transistor M2 ON when the modulation signal Ms is the L level.

Therefore, since the voltage of the driving signal COM-A which is obtained by smoothing the amplification modulation signal by the inductor L1 and the capacitor C1 at the connection point between the first transistor M1 and the second transistor M2 becomes higher as the duty ratio of the modulation signal Ms becomes larger, and becomes lower as the duty ratio becomes smaller, consequentially, the driving signal COM-A is controlled to be a signal obtained by enlarging the voltage of the original driving signal Aa, and output.

Since the driving circuit 50 uses the pulse density modulation, the driving circuit 50 has an advantage that a variation width of the duty ratio becomes larger compared to a pulse width modulation in which the modulation frequency is fixed.

In other words, since the minimum positive pulse width and negative pulse width which can be handled in the entire circuit are restricted by characteristics of the circuit, only a predetermined range (for example, a range of 10% to 90%) can be ensured as the variation width of the duty ratio in the pulse width modulation in which the frequency is fixed. In contrast to this, since the oscillation frequency decreases as the input voltage is separated from the intermediate value in the pulse density modulation, it is possible to increase the duty ratio much higher in a region where the input voltage is high, and to reduce the duty ratio much lower in a region where the input voltage is low. For this reason, in the self-excited oscillation type pulse density modulation, it is possible to ensure a much wider range (for example, a range of 5% to 95%) as the variation range of the duty ratio.

In addition, the driving circuit 50 performs the self-excited oscillation, and a circuit which generates a carrier wave of high frequency is not necessary, unlike separately-excited oscillation. For this reason, there is an advantage that it is easy to perform integration at a part except for the circuit which handles the high frequency, that is, a part of the integrated circuit device 500.

Additionally, in the driving circuit 50, since not only the path via the terminal Vfb, but also the path which sends back the high frequency component via the terminal Ifb is provided as a feedback path of the driving signal COM-A, the delay in the entire circuit becomes smaller. For this reason, since the frequency of the self-excited oscillation becomes higher, the driving circuit 50 can generate the driving signal COM-A with high accuracy.

Returning to FIG. 10, in the example illustrated in FIG. 10, the resistor R1, the resistor R2, the first transistor M1, the second transistor M2, the capacitor C5, the diode D10, and the low pass filter 560 are configured as the output circuit 550 which generates the amplification control signal based on the modulation signal, generates the driving signal based on the amplification control signal, and outputs the driving signal to a capacitive load (piezoelectric element 60).

The first power source portion 530 applies the signal to a terminal different from a terminal to which the driving signal of the piezoelectric element 60 is applied. The first power source portion 530 is configured of a constant voltage circuit, such as a bandgap reference circuit. The first power source portion 530 outputs the voltage VBS from a terminal VBS. In the example illustrated in FIG. 10, the first power source portion 530 generates the voltage VBS by using a ground potential of the ground terminal Gnd as a reference.

The boosting circuit 540 supplies a power source to the gate driver 520. In the example illustrated in FIG. 10, the boosting circuit 540 boosts the voltage Vdd supplied from the power source terminal Vdd by using the ground potential of the ground terminal Gnd as a reference, and generates the voltage Vm which becomes the power source voltage on the high-potential side of the second gate driver 521L. The boosting circuit 540 can be configured of a charge pump circuit or a switching regulator. In the example illustrated in FIG. 10, the boosting circuit 540 is configured of a charge pump circuit which uses a capacitor C6 in which both ends are respectively connected to a terminal Cp1 and a terminal Cp2, a capacitor C7 in which both ends are respectively connected to a terminal Cp3 and a terminal Cp4, and a capacitor C8 in which both ends are respectively connected to the terminal Gvd and the ground. The boosting circuit 540 is configured of the charge pump circuit, but compared to a case where the boosting circuit 540 is configured of a switching regulator, it is possible to suppress the generation of noise. For this reason, in the driving circuit 50, it is possible to generate the driving signal COM-A with much higher accuracy, to control the voltage applied to the piezoelectric element 60 with high accuracy, and thus, to improve the discharge accuracy of the liquid. In addition, it is possible to load the boosting circuit 540 on the integrated circuit device 500 since the size thereof is reduced as a power source generation portion of the gate driver 520 is configured of the charge pump circuit, and compared to a case where the power source generation portion of the gate driver 520 is configured on the outside of the integrated circuit device 500, it is possible to substantially reduce the entire circuit area of the driving circuit 50.

As will be described later, the boosting control portion 580 generates a first clock signal $\phi 1$ and a second clock signal $\phi 2$, selects any one of the clock signals as a boosting clock signal $\phi$, and controls the boosting in the boosting circuit 540 based on the boosting clock signal $\phi$. A switching point of rising or falling of the second clock signal $\phi 2$ is synchronized with the modulation signal Ms. For example, the boosting control portion 580 may generate the second clock signal $\phi 2$ based on the modulation signal Ms and the first clock signal $\phi 1$.

When at least one pulse (a predetermined number of pulses) included in the modulation signal Ms is input to the boosting control portion 580, the boosting control portion 580 may control the boosting based on the second clock signal φ2.

Figure 12:
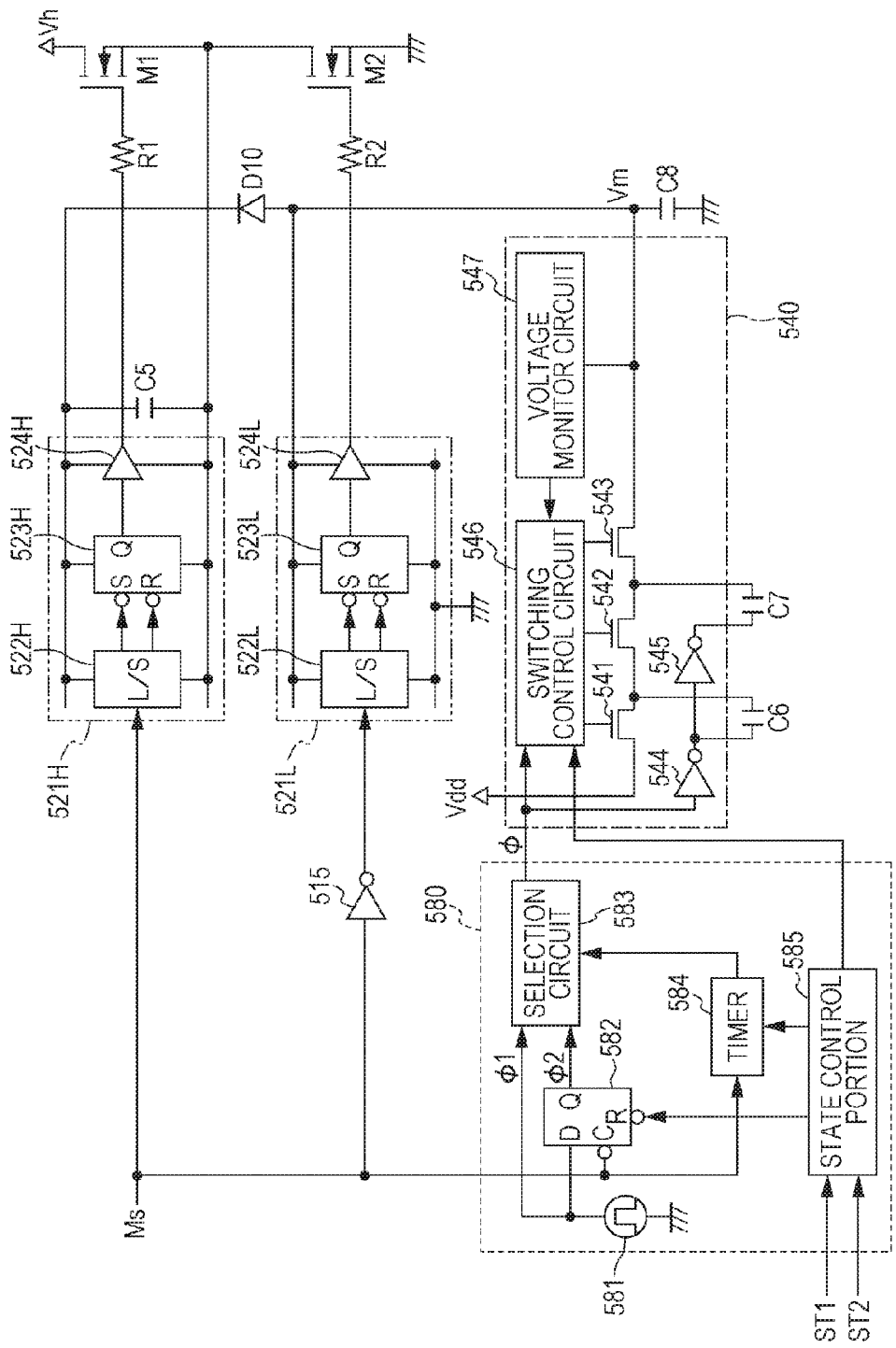
FIG. 12 is a view illustrating a circuit configuration of a first gate driver, a second gate driver, a boosting circuit, and a boosting control circuit.

FIG. 12 is a view illustrating a circuit configuration of the first gate driver 521H, the second gate driver 521L, the boosting circuit 340, and a boosting control circuit 380. In FIG. 12, the same configuration elements as those in FIG. 10 are on the same reference numerals. In addition, in FIG. 12, a part of other configuration elements of the driving circuit 50 of FIG. 10 are also illustrated.

As illustrated in FIG. 12, the first gate driver 521H is provided with a level shifter 522H, an SR latch 523H, and a driver 524H, and operates the capacitor C5 as a floating power source.

The level shifter 522H level-shifts the modulation signal Ms, generates a set signal and a reset signal, and outputs the signals to the SR latch 523H.

The SR latch 523H outputs a signal which is the H level when the set signal is the L level and the reset signal is the H level, and outputs a signal which is the L level when the set signal is the H level and the reset signal is the L level. In addition, the SR latch 523H holds the H level or the L level of the output signal when the set signal is the H level and the reset signal is the H level. In addition, since the logic level of the output signal of the SR latch 523H becomes undefined when the set signal is the L level and the reset signal is the L level, it is prohibited to input the set signal as the L level and the reset signal as the L level.

The driver 524H buffers the output signal of the SR latch 523H, and generates and outputs the amplification control signal which controls the first transistor M1.

Since the first gate driver 521H is operated by using the capacitor C5 as a floating power source, the potential of the terminal Bst repeats transition between Vm (for example, 7.5 V) and Vh+Vm (for example, 49.5 V). By holding the signal by the SR latch 523H, it is possible to stabilize and operate the first gate driver 521H even in a state where the potential of the terminal Bst is transient in the middle of the transition.

The second gate driver 521L is provided with a level shifter 522L, an SR latch 523L, and a driver 524L, and is operated by using the substantially constant voltage Vm (for example, 7.5 V) as a power source voltage.

The level shifter 522L level-shifts the negative signal (output signal of the inverter 515) of the modulation signal Ms, generates a set signal and a reset signal, and outputs the signals to the SR latch 523L.

Similarly to the SR latch 523H, the SR latch 523L outputs a signal which is the H level when the set signal is the L level and the reset signal is the H level, and outputs a signal which is the L level when the set signal is the H level and the reset signal is the L level. In addition, similarly to the SR latch 523H, the SR latch 523L holds the H level or the L level of the output signal when the set signal is the H level and the reset signal is the H level, and the logic level of the output signal becomes undefined when the set signal is the L level and the reset signal is the L level.

The driver 524L buffers the output signal of the SR latch 523L, and generates and outputs the amplification control signal which controls the second transistor M2.

In addition, since the potential of the terminal Gvd is the substantially constant voltage Vm (for example, 7.5 V), the necessity of the SR latch 523L is relatively low compared to the SR latch 523H. Therefore, the second gate driver 521L may have a configuration in which the level shifter 522L simply level-shifts the negative signal of the modulation signal Ms and outputs the signal to the driver 524L.

As illustrated in FIG. 12, the boosting circuit 540 is provided with three NMOS switches 541, 542, and 543, two inverters 544 and 545, a switching control circuit 546, and a voltage monitor circuit 547, and is configured as a charge pump circuit which can boost the voltage Vdd three times based on the boosting clock signal φ.

The switching control circuit 546 makes the NMOS switch 541 and the NMOS switch 543 ON and makes the NMOS switch 542 OFF when the boosting clock signal φ is the H level (Vdd). At this time, since the output of the inverter 544 is the L level (0 V), the potential difference between both ends of the capacitor C6 becomes Vdd, and the capacitor C6 is charged. In addition, since the output of the inverter 545 is the H level (Vdd), the potential difference between both ends of the capacitor C8 becomes equivalent to Vdd+the potential difference between both ends of the capacitor C7, a part of charges accumulated in the capacitor C7 moves, and the capacitor C8 is charged.

In addition, the switching control circuit 546 makes the NMOS switch 541 and the NMOS switch 543 OFF, and makes the NMOS switch 542 ON when the boosting clock signal φ is the L level (0 V). Since the output of the inverter 544 is the H level (Vdd) and the output of the inverter 545 is the L level (0 V), the potential difference between both ends of the capacitor C7 becomes equivalent to Vdd+the potential difference between both ends of the capacitor C7, a part of charges accumulated in the capacitor C6 moves, and the capacitor C7 is charged.

Therefore, as the boosting clock signal φ repeats the H level (Vdd) and the L level (0 V), the potential difference between both ends of the capacitor C6 reaches the maximum Vdd (for example, 3.3 V), the potential difference between both ends of the capacitor C7 reaches the maximum 2 Vdd (for example, 6.6 V), and the potential difference (that is, Vm) between both ends of the capacitor C8 reaches the maximum 3 Vdd (for example, 9.9 V). However, when the voltage Vm becomes too high, a problem that power consumption of the first gate driver 521H and the second gate driver 521L increases is generated. Here, the voltage monitor circuit 547 monitors whether or not the voltage Vm reaches a desired voltage (for example, 7.5 V), outputs a signal of the L level (0 V) when the voltage Vm does not reach the desired voltage, and outputs a signal of the H level (Vdd) when the voltage Vm reaches the desired voltage. The switching control circuit 546 performs the above-described control so that a boosting operation is performed when the output signal of the voltage monitor circuit 547 is the L level (0 V), and controls to stop at least a part of the boosting operation when the output signal of the voltage monitor circuit 547 is the H level (Vdd). Accordingly, the output voltage Vm of the boosting circuit 340 is held to be a substantially constant desired voltage.

As illustrated in FIG. 12, the boosting control portion 580 includes an oscillation circuit 581, a D flip/flop 582, a selection circuit 583, a timer 584, and a state control portion 585, generates and outputs the boosting clock signal φ to the boosting circuit 540, and accordingly, controls the boosting circuit 540.

The oscillation circuit 581 is configured of an RC oscillation circuit or an LC oscillation circuit, and after the power source of the integrated circuit device 500 becomes ON (the power source voltage Vdd is supplied), the oscillation is initiated, and the first clock signal φ1 is output. The oscillation frequency (frequency of the first clock signal φ1) of the oscillation circuit 581 is set to be appropriate frequency (for example, several hundreds of kHz) at which the boosting by the boosting circuit 540 is possible.

After a reset signal XRST is released, the D flip/flop 582 holds the first clock signal φ1 in every falling edge of the modulation signal Ms, and outputs the signal as the second clock signal φ2. In other words, the switching point of the rising or falling of the second clock signal φ2 is synchronized with the modulation signal Ms.

The selection circuit 583 selects at least one of the first clock signal φ1 and the second clock signal φ2 in accordance with the logic level of a selected signal Se1 output by the timer 584, and outputs the signal as the boosting clock signal φ.

The timer 584 counts a pulse number of the modulation signal Ms, and outputs the selected signal Se1 in which the logic level when the count value is less than a predetermined number N (N is an integer which is equal to or greater than 1) and a logic level when the count value is equal to or greater than N, are different.

For example, the timer 584 outputs the selected signal Se1 which is the L level when the count value is less than N, and is the H level when the count value is equal to or greater than N. The selection circuit 583 selects the first clock signal φ1 when the selected signal Se1 is the L level, and selects the second clock signal φ2 when the selected signal Se1 is the H level. In short, the first clock signal φ1 is selected as the boosting clock signal φ until the pulse number of the modulation signal Ms reaches N, and the second clock signal φ2 is selected as the boosting clock signal φ after the pulse number of the modulation signal Ms reaches N.

The state control portion 585 selects a state (operation mode) of the driving circuit 50 in accordance with 2-bit state signals ST1 and ST2, and performs various controls in accordance with the operation mode. The state signals ST1 and ST2 are input from two terminals (not illustrated in FIG. 10) of the integrated circuit device 500.

Figures 13A, 13B:
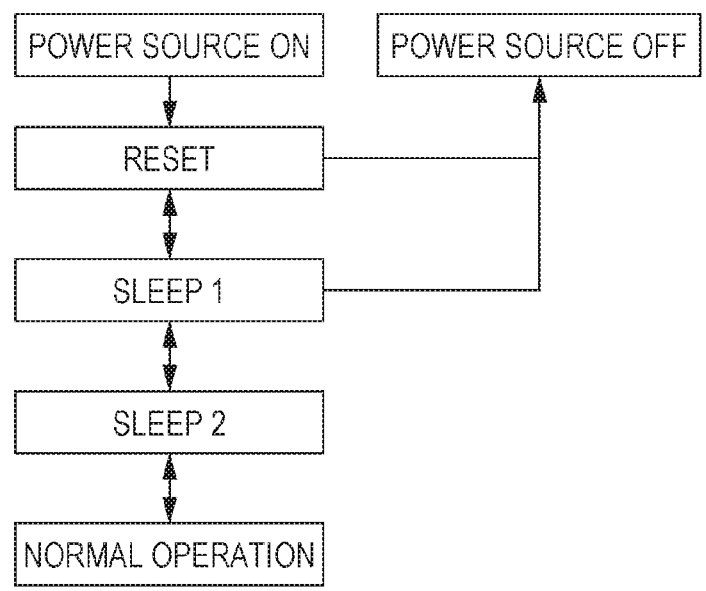
FIGS. 13A and 13B are views illustrating operation modes of an integrated circuit device.

FIG. 13A is a view illustrating a relationship between the state signals ST1 and ST2, and the operation modes of the driving circuit 50. In addition, FIG. 13B is a view illustrating an example of transition of the operation mode.

As illustrated in FIGS. 13A and 13B, after the power source becomes ON to the integrated circuit device 500, when the ST1=0 (L level) and ST2=0 (L level) are input, the state control portion 585 selects a reset mode. The reset mode is a mode in which the operations of each circuit of the driving circuit 50 are initialized and stopped, the boosting circuit 540 is OFF, and both the terminal Ldr and the terminal Hdr are the L level.

In the reset mode, when ST1=0 (L level) and ST2=1 (H level) are input, the state control portion 585 selects a sleep 1 mode. The sleep 1 mode is a mode in which preparation for initiating the boosting operation is performed, the oscillation circuit 581 initiates the oscillation operation, the boosting circuit 540 is OFF, and both the terminal Ldr and the terminal Hdr are the L level. In other words, in the reset mode or the sleep 1 mode, the boosting operation is not performed, and the driving circuit 50 does not perform the self-exited oscillation. In the reset mode or the sleep 1 mode, the state control portion 585 controls the switching control circuit 546 of the boosting circuit 540, and stops the boosting operation by setting all of three NMOS switches 541, 542, and 543 OFF.

In the sleep 1 mode, when ST1=1 (H level) and ST2=0 (L level) are input, the state control portion 585 selects a sleep 2 mode. The sleep 2 mode is a mode in which the boosting operation of the capacitor C8 and charging of the capacitor C5 are performed while the self-excited oscillation is stopped, the boosting circuit 540 is ON, the terminal Ldr is the H level, and the terminal Hdr is the L level. In addition, in the sleep 1 mode, when ST1=0 (L level) and ST2=0 (L level) are input, the state control portion 585 selects the reset mode.

In the sleep 2 mode, when ST1=1 (H level) and ST2=1 (H level) are input, the state control portion 585 selects a normal operation mode. The normal operation mode is a mode in which the self-excited oscillation is performed while the driving circuit 50 continues the boosting operation, the boosting circuit 540 is ON, the terminal Ldr is the H level or the L level, and the terminal Hdr is the L level or the H level. In addition, in the sleep 2 mode, when ST1=1 (H level) and ST2=0 (L level) are input, the state control portion 585 selects the sleep 1 mode.

In the normal operation mode, when ST1=1 (H level) and ST2=0 (L level) are input, the state control portion 585 selects the sleep 2 mode. In addition, in the example of FIG. 13B, the power source of the integrated circuit device 500 becomes OFF in the reset mode and the sleep 1 mode.

As illustrated in FIG. 12, the state control portion 585 also controls the reset of the D flip/flop 582 or the timer 584 in accordance with the state (operation mode) of the driving circuit 50. In other words, the state control portion 585 sets the D flip/flop 582 or the timer 584 to be in a reset state, in operation modes (the reset mode, the sleep 1 mode, and the sleep 2 mode) except for the normal operation mode, and releases the reset state of the D flip/flop 582 or the timer 584 in the normal operation mode.

The boosting control portion 580 configured in this manner controls the boosting by the boosting circuit 540 based on the first clock signal φ1 in the operation modes (the reset mode, the sleep 1 mode, and the sleep 2 mode) except for the normal operation mode. In addition, after the shift from the sleep 2 mode to the normal operation mode, the boosting control portion 580 controls the boosting based on the first clock signal φ1 until the driving circuit 50 initiates the self-excited oscillation, and N pulses included in the modulation signal Ms are input to the timer 584, and after the N pulses are input to the timer 584, the boosting control portion 580 controls the boosting by the boosting circuit 540 based on the second clock signal φ2 which is synchronized with the switching point of the modulation signal Ms. In FIG. 14, an example of a time chart before and after the selection of the boosting clock signal φ is switched from the first clock signal φ1 to the second clock signal φ2 is illustrated. In addition, as the predetermined number N, for example, the pulse number which can determine that the self-excited oscillation is stabilized is set.

In the embodiment, the reason why the boosting clock signal φ is not switched from the first clock signal φ1 to the second clock signal φ2 immediately after the shift from the sleep 2 mode to the normal operation mode, and is switched after the self-excited oscillation is initiated, is as follows.

The boosting operation by the boosting circuit 540 is performed in the sleep 2 mode, the capacitor C8 is charged, and the desired voltage Vm (for example, 7.5 V) is generated to the terminal Gvd. In this state, when the mode is shifted to the normal operation mode, the self-excited oscillation is initiated, but, for example, several hundreds of ms of time delay is generated until an initial pulse is generated in the modulation signal Ms (refer to FIG. 14).

Therefore, if the first clock signal φ1 is switched to the second clock signal φ2 immediately after the shift from sleep 2 mode to the normal operation mode, for example, for several hundreds of ms, the boosting clock signal φ is fixed to the L level, and the boosting operation by the boosting circuit 540 is stopped. As a result, while the boosting operation is stopped, a part of charges accumulated in the capacitor C8 is discharged, and the voltage Vm of the terminal Gvd deteriorates.

In this case, there is that the tendency of the power source voltage of the first gate driver 521H or the second gate driver 521L to decrease, and the self-excited oscillation is not initiated. Since the pulse is not generated to the modulation signal Ms when the self-excited oscillation is not initiated, the second clock signal $\phi 2$ is fixed to the L level (the boosting clock signal $\phi$ is also fixed to the L level), and the boosting circuit 540 cannot restart the boosting operation.

In this manner, there is a concern that a deadlock state where the self-excited oscillation is not initiated as the boosting operation is stopped, and the boosting operation cannot be restarted as the self-excited oscillation is not initiated, is caused. In contrast to this, by switching the boosting clock signal $\phi$ from the first clock signal $\phi 1$ to the second clock signal $\phi 2$ after the self-excited oscillation is initiated, the deadlock state can be avoided.

In addition, in the embodiment, the reason why the second clock signal $\phi 2$ is synchronized not with the rising but with the falling of the modulation signal Ms, is as follows.

In the normal operation mode, the rising of the modulation signal Ms corresponds to a timing when the first transistor M1 is shifted from OFF to ON. In a state where the first transistor M1 is OFF, the terminal Sw is 0 V, the set signal input to the SR latch 523H of the first gate driver 521H becomes Vm (for example, 7.5 V), and the reset signal becomes 0 V.

In this state, when the set signal input to the SR latch 523H becomes 0 V from Vm, and the reset signal becomes Vm from 0 V, the first transistor M1 is ON, and the terminal Sw rapidly rises to Vh (for example, 42 V) from 0 V. Accordingly, the set signal input to the SR latch 523H changes from 0 V to Vh (for example, 42 V), and the reset signal changes from Vm (for example, 7.5 V) to Vh+Vm (for example, 49.5 V), but these changes take time depending on a parasitic capacitance between a set terminal of the SR latch 523H and the ground, and a parasitic capacitance between the reset terminal and the ground. Therefore, by using the voltage Vh (for example, 42 V) of the terminal Sw as a reference, transiently, both the set signal and the reset signal are likely to be the L level.

In addition, when both the set signal and the reset signal are the L level, since the logic level of the output level of the SR latch 523H is undefined, there is a possibility that the signal transiently becomes the L level and the first transistor M1 is instantly ON. In other words, when the first transistor M1 is shifted from OFF to ON, the first gate driver 521H is in a state where malfunction is likely to be caused. In addition, in case of the second gate driver 521L, since the power source voltage thereof is fixed to Vm, the malfunction is not caused.

Meanwhile, since the boosting circuit 540 switches ON/OFF of three NMOS switches 541, 542, and 543, and performs charging and discharging of three capacitors C6, C7, and C8 in accordance with the second clock signal $\phi 2$ in the normal operation mode, noise is superimposed on the voltage Vm in the rising or falling of the second clock signal $\phi 2$.

Therefore, when the second clock signal $\phi 2$ is synchronized with the rising of the modulation signal Ms, a timing when the first gate driver 521H is likely to cause malfunction, and a timing when the boosting circuit 540 generates noise become close to each other, and the malfunction of the first gate driver 521H is likely to be caused due to the influence of noise.

Meanwhile, in the normal operation mode, the falling of the modulation signal Ms corresponds to the timing when the first transistor M1 is shifted from ON to OFF. In a state where the first transistor M1 is ON, the terminal Sw is Vh (for example, 42 V), the set signal input to the SR latch 523H of the first gate driver 521H becomes Vh (for example, 42 V), and the reset signal becomes Vh+Vm (for example, 49.5 V).

In this state, when the set signal input to the SR latch 523H becomes Vh+Vm from Vh, and the reset signal becomes Vh from Vh+Vm, the first transistor M1 is OFF, and the terminal Sw rapidly falls to 0 V from Vh (for example, 42 V). Accordingly, the set signal input to the SR latch 523H changes from Vh+Vm (for example, 49.5 V) to Vm (for example, 7.5 V), and the reset signal changes from Vh (for example, 42 V) to 0 V, but these changes take time depending on the parasitic capacitance between the set terminal of the SR latch 523H and the ground, and the parasitic capacitance between the reset terminal and the ground. Therefore, by using the voltage 0 V of the terminal Sw as a reference, transiently, both the set signal and the reset signal are likely to be the H level.

However, when both the set signal and the reset signal are the H level, since the logic level of the output level of the SR latch 523H is held, the first transistor M1 maintains an OFF state. In other words, when the first transistor M1 is shifted from ON to OFF, the first gate driver 521H is in a state where malfunction is unlikely to be caused.

Therefore, when the second clock signal $\phi 2$ is synchronized with the falling of the modulation signal Ms, a timing when the first gate driver 521H is unlikely to cause malfunction, and a timing when the boosting circuit 540 generates noise become close to each other (that is, the timing when the first gate driver 521H is likely to cause malfunction, and a timing when the boosting circuit 540 generates noise becomes far from each other), and it is possible to reduce the tendency of the malfunction due to the influence of noise.

As described above, according to the embodiment, since the switching point of the rising or falling of the second clock signal $\phi 2$ is synchronized with the modulation signal Ms generated by the self-excited oscillation of the driving circuit 50, as the boosting circuit 540 performs the boosting based on the second clock signal $\phi 2$, it is always possible to set the timing when noise is generated by the boosting circuit 540 close to a desired timing in the self-excited oscillation. In particular, by setting the timing of the rising or falling of the second clock signal $\phi 2$ which is superimposed on the voltage Vm in which noise generated by the boosting circuit 540 close to the timing of the falling (falling of the pulse) of the modulation signal when the gate driver 520 (in particular, the first gate driver 521H) is unlikely to receive the influence of noise, it is possible to reduce the influence of noise of the boosting circuit 540 on the driving signal COM-A (COM-B), and to reduce to tendency of the discharge accuracy to deteriorate.

In addition, according to the embodiment, the boosting circuit 540 can perform the boosting based on the first clock signal $\phi 1$ before the modulation signal Ms is generated by the self-excited oscillation of the driving circuit 50, that is, before the second clock signal $\phi 2$ which is synchronized with the modulation signal Ms is generated. In addition, since the boosting circuit 540 can perform the boosting based on the second clock signal $\phi 2$ after the second clock signal $\phi 2$ is generated (after the timer 584 counts the predetermined number of pulses of the modulation signal Ms), it is possible to reduce the tendency of the boosted voltage to decrease and the self-excited oscillation to be stopped.

In addition, in the embodiment, the oscillation frequency of the modulation signal may be 1 MHz to 8 MHz.

In the above-described liquid discharging apparatus 1, the amplification modulation signal is smoothed, the driving signal is generated, the piezoelectric element 60 is displaced as the driving signal is applied, and liquid is discharged from the nozzle 651. Here, when the liquid discharging apparatus 1 performs frequency spectrum analysis with respect to the waveform of the driving signal for discharging small dots, it is confirmed that the frequency component which is equal to or greater than 50 kHz is included. In order to generate the driving signal which includes the frequency component which is equal to or greater than 50 kHz, the frequency of the modulation signal (frequency of the self-excited oscillation) is required to be equal to or greater than 1 MHz.

If the frequency is lower than 1 MHz, an edge of the waveform of the reproduced driving signal is blunt and round. In other words, an angle is rounded and the waveform becomes blunt. When the waveform of the driving signal is blunt, the displacement of the piezoelectric element 60 which is operated in accordance with the rising or falling edge of the waveform becomes gentle, tailing during the discharge or a discharge defect is generated, and the quality of printing deteriorates.

Meanwhile, if the frequency of the self-excited oscillation is higher than 8 MHz, resolution of the waveform of the driving signal increases. However, as switching frequency increases in the transistor, a switching loss increases, and compared to linear amplification of a class-AB amplifier or the like, excellent power saving performance and generated heat saving performance are damaged.

For this reason, in the liquid discharging apparatus 1, the head unit 20, the integrated circuit device for capacitive load driving 500, and the capacitive load driving circuit 50, it is preferable that the frequency of the modulation signal is 1 MHz to 8 MHz.

In addition, in the embodiment, the boosting control portion 580 switches the boosting clock signal $\phi$ from the first clock signal $\phi 1$ to the second clock signal $\phi 2$ after waiting until the self-excited oscillation is initiated (the self-excited oscillation is stabilized) by counting the pulse number of the modulation signal Ms by the timer 584, but the boosting clock signal $\phi$ may be switched by another method.

For example, the boosting control portion 580 may shift from the sleep 2 mode (first mode) to the normal operation mode (second mode) after controlling the boosting by the boosting circuit 540 based on the first clock signal $\phi 1$ in the sleep 2 mode (first mode), control the boosting by the boosting circuit 540 based on the first clock signal $\phi 1$ before the predetermined period elapses after the shift to the normal operation mode (second mode) in the normal operation mode (second mode), and control the boosting by the boosting circuit 540 based on the second clock signal $\phi 2$ after the predetermined period elapses.

For example, in the configuration of FIG. 12, the boosting control portion 580 may switch the signal input to the timer 584 from the modulation signal Ms to the first clock signal $\phi 1$. In this configuration, as the predetermined number N which is counted by the timer 584, for example, the pulse number obtained by dividing the time required until stabilizing the self-excited oscillation by the cycle of the first clock signal $\phi 1$ is set. Otherwise, in the configuration of the FIG. 12, the boosting control portion 580 may switch the timer 584 to a comparator which compares an RC time constant circuit which initiates the operation when moving to the normal operation mode, and the output voltage of the RC time constant circuit, to a predetermined threshold value. In this case, for example, when the time required until the self-excited oscillation is stabilized elapsed, the predetermined threshold value is set so that the output voltage of the RC time constant circuit substantially match the predetermined threshold value.

Above, the embodiment and modification examples are described, but the invention is not limited to the embodiment and the modification examples, and can be carried out in various aspects without departing the range of the main idea.

The invention includes a configuration (for example, a configuration which has the same functions, methods, and effects, or a configuration which has the same purpose and effects) which is substantially the same as the configuration described in the embodiment. In addition, the invention includes a configuration in which a part which is not essential in the configuration described in the embodiment is replaced. In addition, the invention includes a configuration which achieves the same operation effects, and a configuration which can achieve the same purpose, as those of the configuration described in the embodiment. In addition, the invention includes a configuration in which a known technology is added to the configuration described in the embodiment.

What is claimed is:

1. A driving circuit for driving a capacitive load, comprising:
   a modular which generates a modulation signal pulse-modulated from a source signal;
   a gate driver which generates an amplification control signal based on the modulation signal;
   a transistor which generates an amplification modulation signal amplified from the modulation signal based on the amplification control signal;
   a low pass filter which demodulates the amplification modulation signal and generates a driving signal of a capacitive load;
   a feedback circuit which sends back the driving signal to the modulator;
   a boosting circuit which supplies a voltage which has been boosted based on any one of a first clock signal and a second clock signal to the gate driver; and
   a boosting controller which controls boosting in the boosting circuit,
   wherein the boosting controller controls the boosting based on the second clock signal after controlling the boosting based on the first clock signal, and
   wherein a switching point of rising or falling of the second clock signal is synchronized with the modulation signal.

2. The driving circuit for driving a capacitive load, according to claim 1,
   wherein the frequency of the modulation signal is 1 MHz to 8 MHz.

3. The driving circuit for driving a capacitive load, according to claim 1,
   wherein the boosting circuit is a charge pump circuit.

4. The driving circuit for driving a capacitive load, according to claim 1,
   wherein the boosting controller generates the second clock signal based on the modulation signal and the first clock signal.

5. The driving circuit for driving a capacitive load, according to claim 4, wherein the boosting controller controls the boosting based on the first clock signal in a first mode, shifts from the first mode to a second mode, controls the boosting based on the first clock signal before a predetermined period elapses after shifting to the second mode in the second mode, and controls the boosting based on the second clock signal after the predetermined period elapses.

6. The driving circuit for driving a capacitive load, according to claim 4, wherein the boosting controller controls the boosting based on the second clock signal when at least one pulse included in the modulation signal is input to the boosting controller.

7. An integrated circuit for driving a capacitive load, comprising:

a modulator which generates a modulation signal pulse-modulated from a source signal;

a gate driver which generates an amplification control signal based on the modulation signal;

a boosting circuit which supplies a voltage which has been boosted based on any one of a first clock signal and a second clock signal to the gate driver; and a boosting controller which controls boosting in the boosting circuit, wherein the modulator pulse-modulates the source signal, based on a driving signal which is generated by demodulating amplification modulation signal amplified from the modulation signal based on the amplification control signal, wherein the boosting controller controls the boosting based on the second clock signal after controlling the boosting based on the first clock signal, and wherein a switching point of rising or falling of the second clock signal is synchronized with the modulation signal.

* * * * *